US012663725B2

(12) United States Patent (10) Patent No.: US 12,663,725 B2
Subramanian et al. (45) Date of Patent: Jun. 23, 2026

(54) METHODS AND SYSTEMS TO CALIBRATE RETICLE THERMAL EFFECTS

(71) Applicant: ASML Netherlands B.V., Veldhoven (NL)

(72) Inventors: Raaja Ganapathy Subramanian, Maarheeze (NL); Bearrach Moest, Eindhoven (NL); Alexander Alexandrovich Danilin, Eindhoven (NL); Rowin Meijerink, Valkenswaard (NL); Tim Izaak Johannes Goossen, Waalre (NL); Stanislav Markovich Shumiacher, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 134 days.

(21) Appl. No.: 18/704,532

(22) PCT Filed: Oct. 12, 2022

(86) PCT No.: PCT/EP2022/078447
§ 371 (c)(1),
(2) Date: Apr. 25, 2024

(87) PCT Pub. No.: WO2023/072603
PCT Pub. Date: May 4, 2023

(65) Prior Publication Data
US 2025/0021017 A1 Jan. 16, 2025

Related U.S. Application Data

(60) Provisional application No. 63/272,472, filed on Oct. 27, 2021.

(51) Int. Cl.
*G03F 7/00* (2006.01)

(52) U.S. Cl.
CPC .......... *G03F 7/70516* (2013.01); *G03F 7/705* (2013.01); *G03F 7/70741* (2013.01); *G03F 7/70783* (2013.01); *G03F 7/70875* (2013.01)

(58) Field of Classification Search
CPC .. G03F 7/70516; G03F 7/705; G03F 7/70741; G03F 7/70783; G03F 7/70875;
(Continued)

(56) References Cited

U.S. PATENT DOCUMENTS 6,596,604 B1 7/2003 Lojek et al.
7,025,280 B2 4/2006 Kaushal et al.
(Continued)

FOREIGN PATENT DOCUMENTS

CN 1910517 A 2/2007
CN 101852983 A 10/2010
(Continued)

OTHER PUBLICATIONS

English translation of JP-2010283305-A (Year: 2010).*
(Continued)

*Primary Examiner* — Christina A Riddle
(74) *Attorney, Agent, or Firm* — Finnegan, Henderson, Farabow, Garrett & Dunner LLP

(57) ABSTRACT

A method of reducing effects of heating and/or cooling a reticle in a lithographic process includes conditioning the reticle to adjust an initial temperature of the reticle to a predetermined temperature, reducing stress in the reticle to reduce parasitic thermal effects, calibrating a reticle heating model by exposing the reticle and a non-production substrate to a dose of radiation, and processing a production substrate by exposing the reticle and a production substrate to a dose of radiation based on the reticle heating model. The method can increase calibration accuracy and speed of the reticle heating model, reduce conditioning times of the
(Continued)

reticle, reduce stress in the reticle, avoid rework of production substrates, and increase throughput, yield, and accuracy.

13 Claims, 8 Drawing Sheets

(58) Field of Classification Search
CPC . G03F 7/7085; G03F 7/20; G03F 7/70; G03F 7/70504; G03F 7/70483; G03F 7/70491; G03F 7/70508; G03F 7/70525; G03F 7/70533; G03F 7/70541; G03F 7/70633; G03F 7/70691; G03F 7/70716; G03F 7/70725; G03F 7/70733; G03F 7/70775; G03F 7/70858; G03F 7/70866; G03F 7/70841; G03F 7/70908; G03F 7/70925; G03F 7/70933; G03F 7/70916; G03F 7/70991; G03F 7/70983; G03F 7/70975; G03F 7/70825; G03F 7/70833; G03F 7/70891; G03F 1/68; G03F 1/78; G03F 1/84; G03F 7/70616; G03F 7/707
USPC .................. 355/18, 30, 52–55, 66–77; 430/5
See application file for complete search history.

(56) References Cited

U.S. PATENT DOCUMENTS

| | | | |
|---|---|---|---|
| 7,564,536 B2 | 7/2009 | Ottens et al. | |
| 8,417,018 B2 | 4/2013 | Inazuki et al. | |
| 10,281,825 B2 | 5/2019 | Kupers et al. | |
| 10,429,749 B2 | 10/2019 | Kant et al. | |
| 11,099,319 B2 | 8/2021 | Uebel et al. | |
| 2012/0120379 A1* | 5/2012 | Phillips | G03F 7/70783 |
| | | | 355/52 |
| 2016/0179018 A1* | 6/2016 | Holzmann | G03F 7/70891 |
| | | | 355/30 |
| 2018/0259859 A1* | 9/2018 | Kant | G03F 7/705 |
| 2018/0275525 A1* | 9/2018 | Bow | G03F 7/70875 |
| 2020/0166854 A1 | 5/2020 | Yagubizade et al. | |
| 2021/0033987 A1 | 2/2021 | Yang et al. | |
| 2024/0134289 A1* | 4/2024 | Van Goch | G03F 7/70508 |

FOREIGN PATENT DOCUMENTS

| | | | |
|---|---|---|---|
| CN | 107976872 A | | 5/2018 |
| CN | 113093478 A | | 7/2021 |
| JP | 2010283305 A | * | 12/2010 |
| TW | 2004-03829 A | | 3/2004 |
| TW | 2007-25162 A | | 7/2007 |
| WO | WO 2008/140585 A1 | | 11/2008 |
| WO | WO 2020/094369 A1 | | 5/2020 |
| WO | WO 2021/043519 A1 | | 3/2021 |

OTHER PUBLICATIONS

International Search Report and Written Opinion of the International Searching Authority directed to International Patent Application No. PCT/EP2022/078447, mailed Jan. 30, 2023; 10 pages.
Kim et al., "Reticle Heating Feed-forward Control (RHC2) on NXT:1980Di immersion scanner for enhanced on-product overlay," Proc. of SPIE, Optical Microlithography XXX, vol. 10147, Mar. 24, 2017; pp. 1-6.
Abdo et al., "Thermal response of optical reticles: experimental verification of finite element models," Journal of Micro/Nanolithography, MEMS, and MOEMS, vol. 3, No. 2, Apr. 1, 2004; pp. 232-238.
"Novel design of reticle alignment within a lithographic apparatus," Research Disclosure No. 687026, Jun. 9, 2021; 4 pages.

* cited by examiner

METHODS AND SYSTEMS TO CALIBRATE RETICLE THERMAL EFFECTS

CROSS-REFERENCE TO RELATED APPLICATIONS

This application claims priority of U.S. Provisional Application No. 63/272,472, which was filed on Oct. 27, 2021, and which is incorporated herein in its entirety by reference.

FIELD

The present disclosure relates to reticle calibration apparatuses, systems, and methods, for example, reticle calibration apparatuses, systems, and methods to reduce thermal effects in a lithographic process.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, deep ultraviolet (DUV) radiation with a wavelength of 157 nm or 193 nm or 248 nm.

A lithographic apparatus can include a reticle stage to hold a patterning device (e.g., a reticle) to transfer a pattern to a substrate. Reticle heating and/or cooling can cause changes in reticle properties that can affect the radiation beam path (e.g., focus) and cause distortions in the patterned substrate (e.g., overlay errors). Changes in reticle properties can be modeled and corrected with a reticle heating model. Current reticle heating models rely on a sensor-based approach to calibrate the reticle heating model with a reticle temperature sensor (RTS) and require a calibration lot of production wafers. In some examples, this approach can be inaccurate and inefficient since the RTS can exhibit errors, introduce unnecessary delays, and require rework of production wafers.

SUMMARY

Accordingly, there is a need to, e.g., increase calibration accuracy and speed of a reticle heating model, reduce conditioning times of a reticle, reduce stress in the reticle, avoid rework of production substrates, and/or increase fabrication throughput and yield of a lithographic process.

In some aspects, a method of reducing effects of heating and/or cooling a reticle in a lithographic process includes conditioning the reticle to adjust an initial temperature of the reticle to a predetermined temperature. In some aspects, the method further includes reducing stress in the reticle to reduce parasitic thermal effects. In some aspects, the method further includes calibrating a reticle heating model by exposing the reticle and a non-production substrate to a dose of radiation. In some aspects, the method further includes acclimating the reticle by exposing the reticle and a non-production substrate to a dose of radiation. In some aspects, the method further includes processing a production substrate by exposing the reticle and the production substrate to a dose of radiation based on the reticle heating model. In some aspects, calibration accuracy and speed of the reticle heating model can be increased, stress in the reticle can be reduced, rework of production substrates can be avoided, and fabrication throughput and yield of the lithographic process can be increased.

In some aspects, the conditioning includes measuring a reticle alignment between the reticle and the non-production substrate to determine when the reticle has reached the predetermined temperature. In some aspects, the conditioning speed of the reticle can be increased, a modal deformation approach can be used to measure reticle alignment rather than an RTS, and a non-production (e.g., calibration) substrate can be used rather than a production substrate which increases throughput. In some aspects, a modal deformation based approach can be used to control heating of the reticle and an RTS can be omitted.

In some aspects, the measuring the reticle alignment is based on one or more alignment marks on the reticle. In some aspects, alignment marks for reticle alignment are measured for each production substrate and can also be used to determine the reticle temperature and increase calibration efficiency.

In some aspects, the conditioning includes measuring a reticle shape deformation of the reticle to determine when the reticle has reached the predetermined temperature. In some aspects, the conditioning speed of the reticle can be increased, a modal deformation approach can be used to measure reticle shape deformation rather than an RTS, and a non-production (e.g., calibration) substrate can be used rather than a production substrate which increases throughput. In some aspects, a non-production (e.g., calibration) substrate can be used to increase throughput, yield, repeatability, and accuracy.

In some aspects, the measuring the reticle shape deformation is based on one or more edge alignment marks on the reticle. In some aspects, edge alignment marks for reticle shape deformation can be used throughout the calibration process (e.g., at each phase) to quickly determine the reticle temperature and increase calibration efficiency.

In some aspects, the conditioning further includes converting the measured reticle shape deformation to a reticle temperature using a finite element model (FEM). In some aspects, the FEM can be used to measure the reticle temperature based on the reticle shape deformation rather than an RTS.

In some aspects, the conditioning includes using a fixed amount of production substrates to determine when the reticle has reached the predetermined temperature. In some aspects, a fixed amount of production substrates (e.g., minimum of two or more wafers, maximum of forty or less wafers) can be used, depending on the initial temperature of the reticle, to reduce rework of production substrates and increase throughput.

In some aspects, the conditioning includes using decision-based and/or machine learning to determine when the reticle has reached the predetermined temperature. In some aspects, the conditioning speed of the reticle can be increased and rework of production substrates can be avoided.

In some aspects, the using decision-based and/or machine learning can include using a regression, a local regression, a non-parametric local regression, a kernel regression, a multivariate adaptive regression, regression trees, a Gaussian process regression, a support vector regression, splines, smoothing splines, nearest neighbors, a neural network, an adaptive window, Kalman filtering, a linear quadratic estimation, or a combination thereof. In some aspects, the decision-based and/or machine learning can increase the conditioning speed of the reticle by deciding when to stop conditioning and rework of production substrates can be avoided. In some aspects, the decision-based and/or machine learning can completely avoid rework of production substrates thereby increasing yield and throughput.

In some aspects, the conditioning includes using key performance indicators (KPIs) based on a reticle alignment and/or a reticle shape deformation to determine when the reticle has reached the predetermined temperature. In some aspects, the KPIs can increase the conditioning speed of the reticle by deciding when to stop conditioning and rework of production substrates can be avoided. In some aspects, the KPIs can completely avoid rework of production substrates thereby increasing yield and throughput.

In some aspects, the conditioning includes heating and/or cooling the reticle in a conditioning slot to flow gas over the reticle. In some aspects, the conditioning slot can increase the conditioning speed of the reticle and increase throughput.

In some aspects, the predetermined temperature is 22° C.±0.2° C. In some aspects, the predetermined temperature can increase calibration accuracy and speed of the reticle heating model and fabrication throughput and yield of the lithographic process can be increased.

In some aspects, the reducing stress includes removing the reticle from a reticle stage to a turret. In some aspects, removing the reticle from the reticle stage to the turret can reduce parasitic thermal effects in the reticle. In some aspects, the reducing stress includes puffing the reticle with a short blast of gas (e.g., inert gas, noble gas, air). In some aspects, puffing the reticle can reduce parasitic thermal effects in the reticle.

In some aspects, the reducing stress includes exposing the reticle and the non-production substrate to a zero dose of radiation. In some aspects, exposing the reticle to a zero dose of radiation can reduce parasitic thermal effects in the reticle.

In some aspects, the exposing further includes measuring a reticle shape deformation and calculating a reticle temperature. In some aspects, the reticle temperature can be measured during the stress release phase which can increase calibration accuracy and speed of the reticle heating model.

In some aspects, the calibrating includes measuring a reticle shape deformation and calculating a reticle temperature. In some aspects, the reticle temperature can be measured during the calibrating phase which can increase calibration accuracy and speed of the reticle heating model.

In some aspects, the calibrating includes inline real-time calibration of the reticle heating model based on one or more non-production substrates and/or one or more non-production lots. In some aspects, the reticle temperature can be measured during the calibration phase with non-production substrates in real-time which can increase calibration accuracy and speed of the reticle heating model, avoid rework of production substrates, and increase fabrication throughput and yield.

In some aspects, the calibrating includes evaluating the reticle heating model for each reticle alignment (RA) between the reticle and a plurality of non-production substrates in a non-production lot. In some aspects, reticle temperature can be based on the RA measurement rather than an RTS measurement, which can increase calibration accuracy and speed of the reticle heating model.

In some aspects, the evaluating includes updating a parameter x of the lithographic process by the following:

$$x_{new} = x_{old} + \gamma \cdot (x_{old} - RA_{results})$$

where $\gamma$ is a gain value and configured to filter out noise. For example, $\gamma$ can be equal to any number within the interval $[-1, 1]$ (e.g., $-1, -0.5, -0.1, 0.1, 0.5, 1$). In some aspects, one or more parameters of the lithographic process (e.g., radiation dose, k-parameter, overlay, etc.) can be updated based on the RA measurement, which can increase calibration accuracy of the reticle heating model and precision of the lithographic process.

In some aspects, the evaluating includes evaluating a reticle alignment (RA) of each of the plurality of non-production substrates until a convergence of at least 90% is reached. In some aspects, the RA measurement can be based on, for example, the convergence (e.g., at least 90%) of one or more k-parameters (e.g., k4, kl8) of different production substrates, which can ensure an accurate measurement of the reticle temperature.

In some aspects, the processing includes inline real-time calibration of the reticle heating model based on one or more production substrates and/or one or more production lots. In some aspects, the reticle temperature can be measured during the processing phase with production substrates in real-time which can increase calibration accuracy and speed of the reticle heating model, avoid rework of production substrates, and increase fabrication throughput and yield.

In some aspects, the processing includes evaluating the reticle heating model for each reticle alignment (RA) between the reticle and a plurality of production substrates in a production lot. In some aspects, reticle temperature can be based on the RA measurement rather than an RTS measurement, which can increase calibration accuracy and speed of the reticle heating model.

In some aspects, the evaluating includes updating a parameter x of the lithographic process by the following:

$$x_{new} = x_{old} + \gamma \cdot (x_{old} - RA_{results})$$

where $\gamma$ is a gain value and configured to filter out noise. For example, $\gamma$ can be equal to any number within the interval $[-1, 1]$ (e.g., $-1, -0.5, -0.1, 0.1, 0.5, 1$). In some aspects, one or more parameters of the lithographic process (e.g., radiation dose, k-parameter, overlay, etc.) can be updated based on the RA measurement, which can increase calibration accuracy of the reticle heating model and precision of the lithographic process.

In some aspects, the evaluating includes evaluating a reticle alignment (RA) of each of the plurality of production substrates until a convergence of at least 90% is reached. In some aspects, the RA measurement can be based on, for example, the convergence (e.g., at least 90%) of one or more k-parameters (e.g., k4, kl8) of different production substrates, which can ensure an accurate measurement of the reticle temperature.

In some aspects, the reticle heating model includes one or more modal deformations describing a relationship between inputs and distortions resulting from the inputs to reduce noise in the reticle heating model. In some aspects, modal deformations can be modeled rather than a signal-based approach (e.g., RTS measurements), which can increase calibration accuracy and speed of the reticle heating model.

In some aspects, the method further includes predicting distortions of the reticle in a lithographic apparatus based on the reticle heating model and inputs in the lithographic process. In some aspects, the reticle heating model can be deterministic or non-deterministic to predict future distortions and can correct for the distortions and can increase the accuracy of the lithographic process (e.g., reduce overlay mismatch).

In some aspects, the inputs in the lithographic process include a dose of radiation from a radiation source, a reticle temperature, a number of production substrates in a production lot, or a combination thereof. In some aspects, the inputs can be adjusted based on the reticle heating model to increase the accuracy of the lithographic process (e.g., reduce overlay mismatch).

In some aspects, the method further includes determining a correction in the lithographic process based on the predicted distortions of the reticle. In some aspects, the reticle heating model can be deterministic or non-deterministic to predict future distortions and can correct for the distortions and can increase the accuracy of the lithographic process (e.g., reduce overlay mismatch).

In some aspects, the correction is a correction of an alignment of a non-production substrate relative to the reticle. In some aspects, reticle alignment can be adjusted based on the reticle heating model to increase the accuracy of the lithographic process (e.g., reduce overlay mismatch).

In some aspects, the correction is a correction of an alignment of a production substrate relative to the reticle. In some aspects, reticle alignment can be adjusted based on the reticle heating model to increase the accuracy of the lithographic process (e.g., reduce overlay mismatch).

In some aspects, a device manufacturing method using a lithographic process includes conditioning a reticle in the lithographic process to adjust an initial temperature of the reticle to a predetermined temperature. In some aspects, the device manufacturing method further includes reducing stress in the reticle to reduce parasitic thermal effects. In some aspects, the device manufacturing method further includes calibrating a reticle heating model by exposing the reticle and a non-production substrate to a dose of radiation. In some aspects, the device manufacturing method further includes patterning a dose of radiation with an image of the reticle with an illumination system. In some aspects, the device manufacturing method further includes projecting the patterned dose of radiation onto a target portion of a production substrate with a projection system. In some aspects, the device manufacturing method further includes processing the production substrate by exposing the reticle and the production substrate to the patterned dose of radiation based on the reticle heating model. In some aspects, calibration accuracy and speed of the reticle heating model can be increased, stress in the reticle can be reduced, rework of production substrates can be avoided, and fabrication throughput and yield of the lithographic process can be increased.

In some aspects, the device manufacturing method further includes predicting distortions of the reticle in a lithographic apparatus based on the reticle heating model and inputs in the lithographic process. In some aspects, the reticle heating model can be deterministic or non-deterministic to predict future distortions and can correct for the distortions and can increase the accuracy of the lithographic process (e.g., reduce overlay mismatch).

In some aspects, the device manufacturing method further includes determining a correction in the lithographic process based on the predicted distortions of the reticle. In some aspects, the reticle heating model can be deterministic or non-deterministic to predict future distortions and can correct for the distortions and can increase the accuracy of the lithographic process (e.g., reduce overlay mismatch).

In some aspects, a lithographic apparatus includes an illumination system configured to illuminate a reticle, a projection system configured to project an image of the reticle onto a patterning substrate, and a controller configured to reduce effects of heating and/or cooling the reticle in a lithographic process. In some aspects, the controller is configured to condition the reticle in the lithographic process to adjust an initial temperature of the reticle to a predetermined temperature. In some aspects, the controller is further configured to reduce stress in the reticle to reduce parasitic thermal effects. In some aspects, the controller is further configured to calibrate a reticle heating model by exposing the reticle and a non-production substrate to a dose of radiation. In some aspects, the controller is further configured to process a production substrate by exposing the reticle and the production substrate to a dose of radiation based on the reticle heating model. In some aspects, calibration accuracy and speed of the reticle heating model can be increased, stress in the reticle can be reduced, rework of production substrates can be avoided, and fabrication throughput and yield of the lithographic process can be increased.

In some aspects, a non-transitory computer readable medium program includes computer readable instructions configured to cause a processor to condition a reticle in a lithographic process to adjust an initial temperature of the reticle to a predetermined temperature. In some aspects, the non-transitory computer readable medium is further configured to cause the processor to reduce stress in the reticle to reduce parasitic thermal effects. In some aspects, the non-transitory computer readable medium is further configured to cause the processor to calibrate a reticle heating model by exposing the reticle and a non-production substrate to a dose of radiation. In some aspects, the non-transitory computer readable medium is further configured to cause the processor to process a production substrate by exposing the reticle and the production substrate to a dose of radiation based on the reticle heating model. In some aspects, calibration accuracy and speed of the reticle heating model can be increased, stress in the reticle can be reduced, rework of production substrates can be avoided, and fabrication throughput and yield of the lithographic process can be increased.

Implementations of any of the techniques described above may include an EUV light source, a DUV light source, a system, a method, a process, a device, and/or an apparatus. The details of one or more implementations are set forth in the accompanying drawings and the description below. Other features will be apparent from the description and drawings, and from the claims.

Further features and exemplary aspects of the aspects, as well as the structure and operation of various aspects, are described in detail below with reference to the accompanying drawings. It is noted that the aspects are not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the aspects and, together with the description, further serve to explain the principles of the aspects and to enable a person skilled in the relevant art(s) to make and use the aspects.

Figure 1:
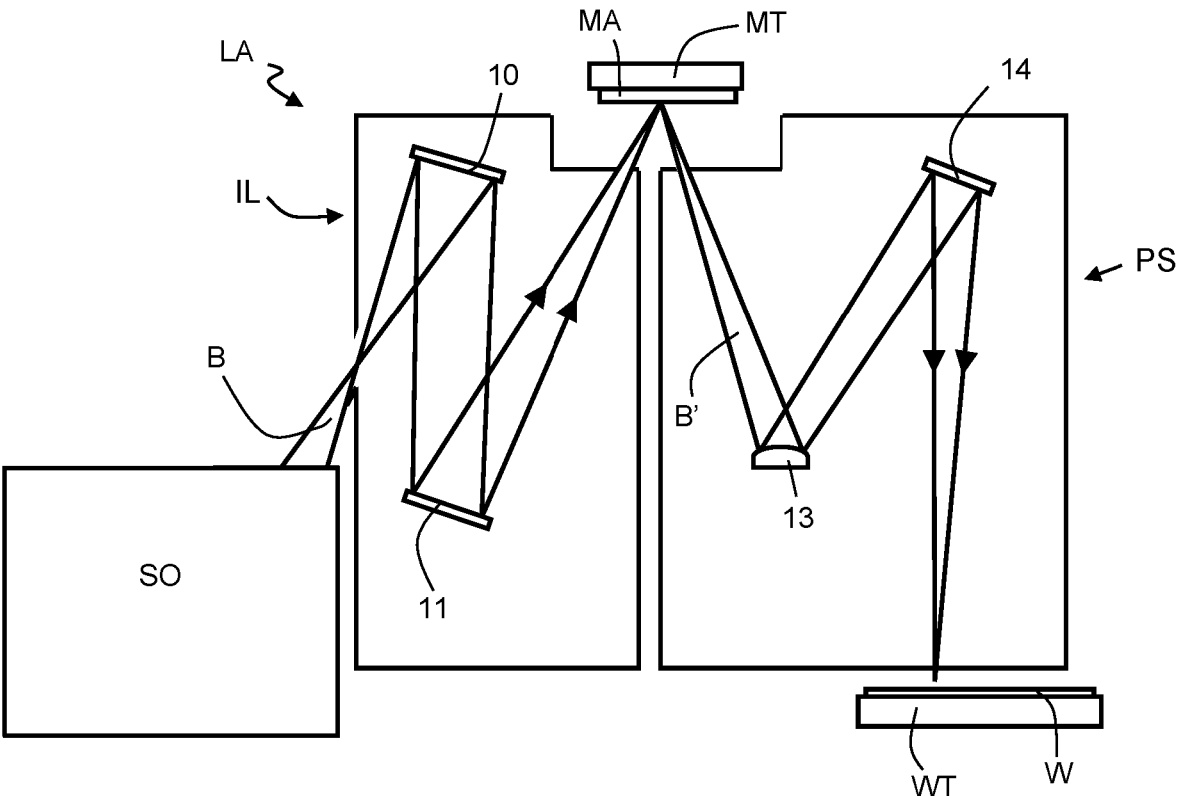
FIG. 1 is a schematic illustration of a lithographic apparatus, according to an exemplary aspect.

The features and exemplary aspects of the aspects will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more aspects that incorporate the features of this present invention. The disclosed aspect(s) merely exemplify the present invention. The scope of the invention is not limited to the disclosed aspect(s). The present invention is defined by the claims appended hereto.

The aspect(s) described, and references in the specification to "one aspect," "an aspect," "an example aspect," "an exemplary aspect," etc., indicate that the aspect(s) described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is understood that it is within the knowledge of one skilled in the art to effect such feature, structure, or characteristic in connection with other aspects whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or ±15% of the value).

The term "parasitic thermal effects" as used herein indicates induced or internal stresses and/or deformations of a reticle, for example, due to heating and/or cooling the reticle (e.g., by resistive heating, gas flow cooling, exposing the reticle to a dose of radiation, etc.) or mechanical pressures and/or deformations from clamping and/or holding the reticle on the reticle stage.

The term "non-production substrate" as used herein indicates a substrate (e.g., a wafer) that is not part of a production lot and is not fabricated by a lithographic process into a device (e.g., an IC chip). For example, a non-production substrate can be a chuck temperature conditioning (CTC) wafer or calibration wafer for a reticle calibration method, for example, to calibrate a reticle heating model and to acclimate the reticle by exposing the reticle and the CTC wafer to a dose of radiation and measuring a reticle alignment and/or a reticle temperature.

The term "production substrate" as used herein indicates a substrate (e.g., a wafer) that is part of a production lot and is fabricated by a lithographic process into a device (e.g., an IC chip). For example, a production substrate can be a wafer (e.g., silicon) for fabrication and inline real-time calibration of a reticle heating model, for example, by exposing the reticle and the wafer to a dose of radiation and measuring a reticle alignment and/or a reticle temperature.

The term "reticle heating model" as used herein indicates a modal deformation approach (e.g., analysis of different reticle mode shapes) to determine reticle heating effects based on reticle alignment and/or reticle shape deformations and a finite element model (FEM) (e.g., COMSOL). For example, the reticle heating model can be deterministic (e.g., no random future states) or non-deterministic (e.g., including random future states) reticle heating effects. Further, the reticle heating model can be deemed a reticle heating execution algorithm (RHEA) that uses inline modal calibrations to determine the baseline reticle heating dynamics. The reticle heating model can be calibrated by exposing a reticle and a non-production substrate to a dose of radiation for inline real-time calibration of the reticle heating model. In some aspects, for example, the reticle heating model can be calibrated by exposing a reticle and a production substrate to a dose of radiation for inline real-time calibration of the reticle heating model. Other reticle heating models utilize a sensor-based approach (e.g., using RTS measurements) to calibrate the reticle heating model. This is described in further detail in U.S. Pat. Nos. 10,429,749, 10,281,825, and U.S. Publication No. 2020/0166854, which are incorporated by reference herein in their entireties.

Reticle heating causes changes in reticle properties that can affect the radiation path and cause fabrication errors (e.g., overlay). Reticle mechanical deformations (e.g., based on reticle temperature) can be calculated and decomposed into k-parameters. Each thermo-mechanical mode (e.g., eigenvector) can be modeled in time using modal participation factor $\mu$ and time constant $\tau$. Measured overlay and/or alignment can be used to model the related k-parameter drifts, which can be used to calculate adjustments to the feed-forward parameters $\mu$ and $\tau$. The reticle heating model can also include adjusting feed-forward parameters $\mu$ and $\tau$. This is described in further detail in U.S. Pat. No. 10,429,749, U.S. Publication No. 2020/0166854, and WIPO Publication No. 2021/043519, which are incorporated by reference herein in their entireties.

The term "finite element model" or "FEM" as used herein indicates a method for numerically solving differential equations arising in the reticle heating model (e.g., heat transfer equations, structural analysis equations, fluid flow equations, etc.). For example, baseline reticle heating dynamics can be analyzed with the FEM through finite element analysis. This is described in further detail in U.S. Pat. Nos. 10,429,749, 10,281,825, and U.S. Publication No. 2020/0166854, which are incorporated by reference herein in their entireties.

The term "key performance indicators" or "KPIs" or "k-parameters" as used herein indicates coefficients of polynomials that are fit to distortions of reticle alignment marks and/or edge alignment marks. The k-parameters parameterize the distortion of the imaging across the field of each substrate. For example, each k-parameter can describe a certain image distortion component (e.g., scaling error, barrel distortion, pincushion distortion, etc.). For example, two important k-parameters are k4 (e.g., k4/my shown in FIG. 7) that represents distortion in Y-axis magnification and k18 (e.g., k18/cshpy shown in FIG. 8) that represents distortion in Y-axis barrel shape. The k-parameters can be used as input to a lithographic process (e.g., lithographic apparatus LA, lithographic cell LC, control system CL) to correct the distortion. This is described in further detail in U.S. Pat. No. 10,429,749, U.S. Publication No. 2020/0166854, and WIPO Publication No. 2021/043519, which are incorporated by reference herein in their entireties.

The term "inline real-time calibration" as used herein indicates calibration of the reticle heating model during actual fabrication of production substrates. For example, a calibration lot of production substrates can be avoided and rework of production substrates for calibration purposes can be reduced or avoided. The calibration can be done inline by exposing a reticle and a production substrate to a dose of radiation. Further, the calibration can be done in real-time (e.g., at a real-time frame rate or a computing rate of 2.56 seconds or less).

Aspects of the disclosure may be implemented in hardware, firmware, software, or any combination thereof. Aspects of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such aspects in more detail, however, it is instructive to present example environments in which aspects of the present disclosure may be implemented.

Exemplary Lithographic System

FIG. 1 shows a lithographic system comprising a radiation source SO and a lithographic apparatus LA. The radiation source SO is configured to generate an EUV and/or a DUV radiation beam B and to supply the EUV and/or DUV radiation beam B to the lithographic apparatus LA. The lithographic apparatus LA comprises an illumination system IL, a support structure MT (e.g., a mask table, a reticle table, a reticle stage) configured to support a patterning device MA (e.g., a mask, a reticle), a projection system PS, and a substrate table WT configured to support a substrate W.

The illumination system IL is configured to condition the EUV and/or DUV radiation beam B before the EUV and/or DUV radiation beam B is incident upon the patterning device MA. Thereto, the illumination system IL may include a faceted field mirror device 10 and a faceted pupil mirror device 11. The faceted field mirror device 10 and faceted pupil mirror device 11 together provide the EUV and/or DUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV and/or DUV radiation beam B interacts with the patterning device MA. This interaction may be reflective (as shown), which may be preferred for EUV radiation. This interaction may be transmissive, which may be preferred for DUV radiation. As a result of this interaction, a patterned EUV and/or DUV radiation beam B' is generated. The projection system PS is configured to project the patterned EUV and/or DUV radiation beam B' onto the substrate W. For that purpose, the projection system PS may comprise a plurality of mirrors 13, 14 which are configured to project the patterned EUV and/or DUV radiation beam B' onto the substrate W held by the substrate table WT. The projection system PS may apply a reduction factor to the patterned EUV and/or DUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV and/or DUV radiation beam B', with a pattern previously formed on the substrate W.

Exemplary Lithographic Cell

Figure 2A:
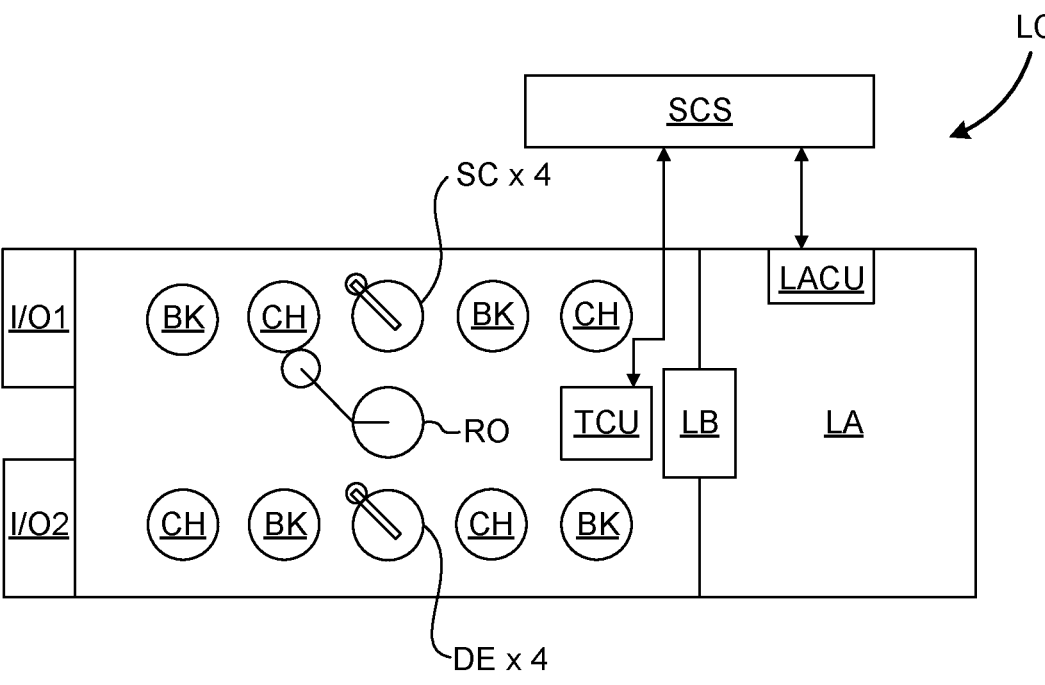
FIG. 2A is a schematic illustration of a lithographic cell, according to an exemplary aspect.

FIG. 2A shows a lithographic cell LC, also sometimes referred to as a lithocell or cluster. Lithographic apparatus LA may form part of lithographic cell LC. Lithographic cell LC may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus LA. These devices, which are often collectively referred to as the track, are under the control of a track control unit TCU which is itself controlled by a supervisory control system SCS, which also controls the lithographic apparatus LA via lithography control unit LACU. Thus, the different apparatuses can be operated to maximize throughput and processing efficiency.

In order for the substrates W exposed by the lithographic apparatus LA to be exposed correctly and consistently, it is desirable to inspect substrates to measure properties of patterned substrates, for example, overlay errors between subsequent layers, line thicknesses, critical dimensions (CD), etc. For this purpose, inspection tools (e.g., metrology tool MT) may be included in lithographic cell LC and/or lithographic apparatus LA. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus or metrology tool MT, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of lithographic cell LC, integrated into lithographic apparatus LA, and/or be a stand-alone device. The inspection apparatus may measure the properties on a latent image (e.g., image in a resist layer after the exposure), on a semi-latent image (e.g., image in a resist layer after a post-exposure bake step), on a developed resist image (e.g., image in which the exposed or unexposed parts of the resist have been removed), or on an etched image (e.g., image after a pattern transfer step, such as etching).

Exemplary Computer System

Figure 2B:
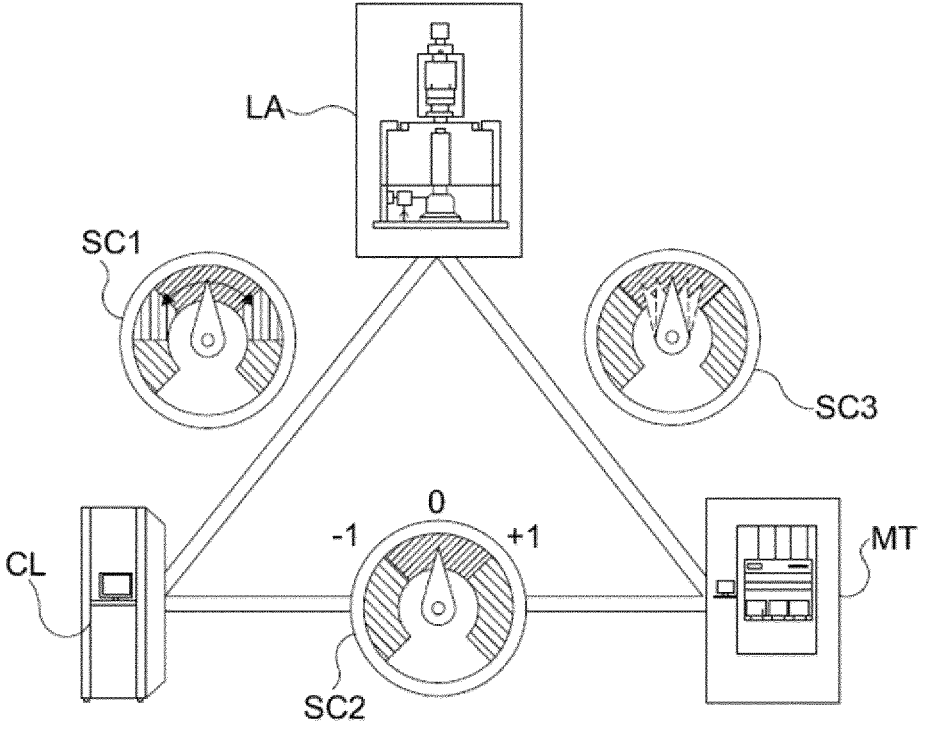
FIG. 2B is a schematic illustration of holistic lithography including a computer system to optimize a lithographic process, according to an exemplary aspect.

FIG. 2B shows a computer system CL, also referred to as a controller or processor. Computer system CL may be part of lithographic cell LC, integrated into lithographic apparatus LA, and/or be a stand-alone device. Computer system CL is configured to optimize a lithographic process, for example, calibrate a reticle heating model. Typically the patterning process in lithographic apparatus LA is one of the most critical steps in the processing, which requires high accuracy of dimensioning and placement of structures on the substrate W. To ensure this high accuracy, three systems can be combined in a so-called "holistic" control environment as schematically depicted in FIG. 2B. As shown in FIG. 2B, the "holistic" environment can include lithographic apparatus LA, computer system CL, and metrology tool MT. For example, lithographic apparatus LA (a first system) can be connected to computer system CL (a second system) and metrology tool MT (a third system).

The key of such holistic lithography is to optimize the cooperation between these three systems to optimize a lithographic process, for example, to enhance the overall process window and provide tight controls loops to ensure that the patterning performed by lithographic apparatus LA stays within a process window. The process window defines a range of process parameters, for example, dose, focus, overlay, etc., within which a specific manufacturing process yields a defined result, for example, a functional semiconductor device—typically within which the process parameters in the lithographic process or patterning process are allowed to vary.

Computer system CL may, for example, use (e.g., part of) the design layout to be patterned to predict which resolution enhancement techniques to use and to perform computational lithography simulations and calculations, for example, to determine which mask layout and lithographic apparatus settings achieve the largest overall process window of the patterning process (shown in FIG. 2B by the double arrow in the first scale SC1). Typically, the resolution enhancement techniques are arranged to match the patterning possibilities of lithographic apparatus LA. Computer system CL may also be used to detect where within the process window lithographic apparatus LA is currently operating (e.g., using input from metrology tool MT) to predict whether defects may be present, for example, due to sub-optimal processing (shown in FIG. 2B by the arrow pointing "0" in the second scale SC2).

Metrology tool MT may provide input to computer system CL, for example, to enable accurate simulations and predictions. For example, metrology tool MT may provide alignment information. Metrology tool MT may provide feedback (e.g., via computer system CL) to lithographic apparatus LA to identify possible drifts, for example, in a calibration status of lithographic apparatus LA (shown in FIG. 2B by the multiple arrows in the third scale SC3). In lithographic processes, it is desirable to make frequent measurements of the structures created, for example, for process control and verification. Different types of metrology tools MT can be used, for example, to measure one or more properties relating to lithographic apparatus LA, a substrate W to be patterned, and/or reticle alignment. This is described in further details in U.S. Pat. No. 11,099,319 and WIPO Publication No. 2021/043519, which are incorporated by reference herein in their entireties.

Exemplary Reticle Stage and Reticle

Figures 3A, 3B:
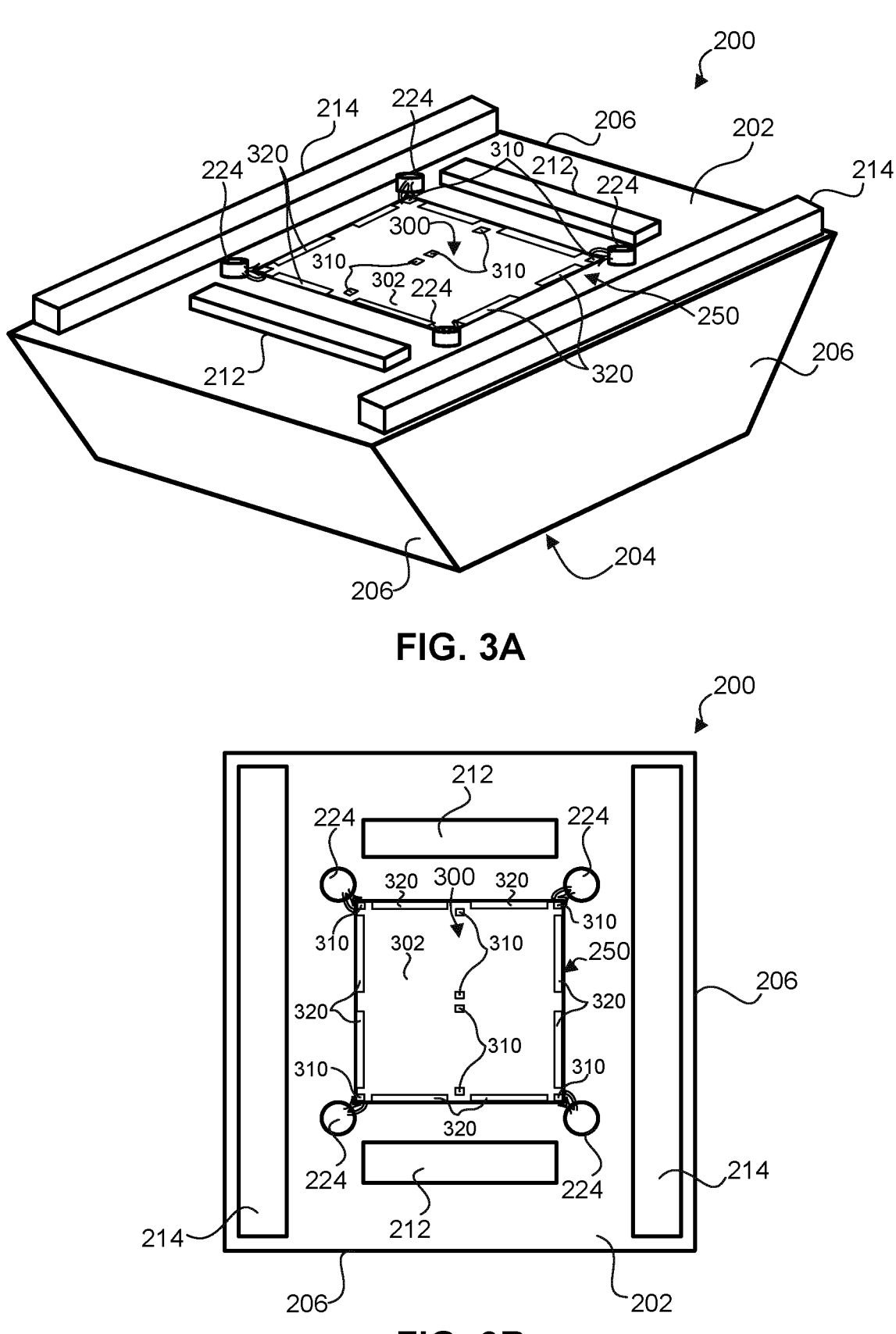
FIG. 3A is a schematic bottom perspective illustration of a reticle stage and a reticle, according to an exemplary aspect.
FIG. 3B is a schematic bottom plan illustration of the reticle stage shown in FIG. 3A.

FIGS. 3A and 3B show schematic illustrations of reticle stage 200, according to exemplary aspects. FIG. 3A is a schematic bottom perspective illustration of reticle stage 200 and reticle 300, according to an example aspect. FIG. 3B is a schematic bottom plan illustration of reticle stage 200 and reticle 300 shown in FIG. 3A.

Reticle stage 200 (e.g., support structure MT) can be used in a lithographic apparatus (e.g., lithographic apparatus LA) to hold a patterning device (e.g., patterning device MA). Reticle stage 200 can include bottom stage surface 202, top stage surface 204, side stage surfaces 206, clamp 250, reticle cage 224, and/or reticle 300. In some aspects, reticle stage 200 with reticle 300 can be implemented in lithographic apparatus LA. For example, reticle stage 200 can be support structure MT in lithographic apparatus LA. In some aspects, reticle 300 can be disposed on bottom stage surface 202 and held by clamp 250. For example, as shown in FIGS. 3A and 3B, reticle 300 can be disposed on clamp 250 (e.g., an electrostatic clamp) at a center of bottom stage surface 202 with reticle frontside 302 facing perpendicularly away from bottom stage surface 202. In some aspects, reticle cage 224 can be disposed on bottom stage surface 202. For example, as shown in FIGS. 3A and 3B, reticle 300 can be disposed at a center of bottom stage surface 202 and secured by reticle cages 224 adjacent to each corner of reticle 300.

In some lithographic apparatuses, for example, lithographic apparatus LA, reticle stage 200 with clamp 250 can be used to hold and position reticle 300 for scanning or patterning operations. In some aspects, as shown in FIGS. 3A and 3B, reticle stage 200 can include first encoder 212 and second encoder 214 for positioning operations. For example, first and second encoders 212, 214 can be interferometers. First encoder 212 can be attached along a first direction, for example, a transverse direction (i.e., X-direction) of reticle stage 200. And second encoder 214 can be attached along a second direction, for example, a longitudinal direction (i.e., Y-direction) of reticle stage 200.

As shown in FIGS. 3A and 3B, reticle 300 can include reticle frontside 302, alignment mark 310, and/or edge alignment mark 320. Alignment mark 310 is configured to measure a reticle alignment between reticle 300 and a substrate (e.g., substrate W, non-production substrate, production substrate). In some aspects, as shown in FIGS. 3A and 3B, one or more alignment marks 310 can be disposed in the corners and/or the center of reticle 300 for an RA measurement. Edge alignment mark 320 is configured to measure a reticle shape deformation of reticle 300 due to thermal expansion when reticle 300 is not within a predetermined temperature (e.g., at 22° C.±0.2° C.). In some aspects, as shown in FIGS. 3A and 3B, one or more edge alignment marks 320 can be disposed along the perimeter edges (e.g., horizontal and vertical edges) of reticle 300 for a reticle shape deformation (RSD) measurement. In some aspects, the results of the RA measurement and/or the RSD measurement can be converted to a reticle temperature, for example, by a FEM that solves for temperature based on reticle alignment and/or reticle deformation.

Exemplary Reticle Exchange Apparatus

Figures 4A, 4B:
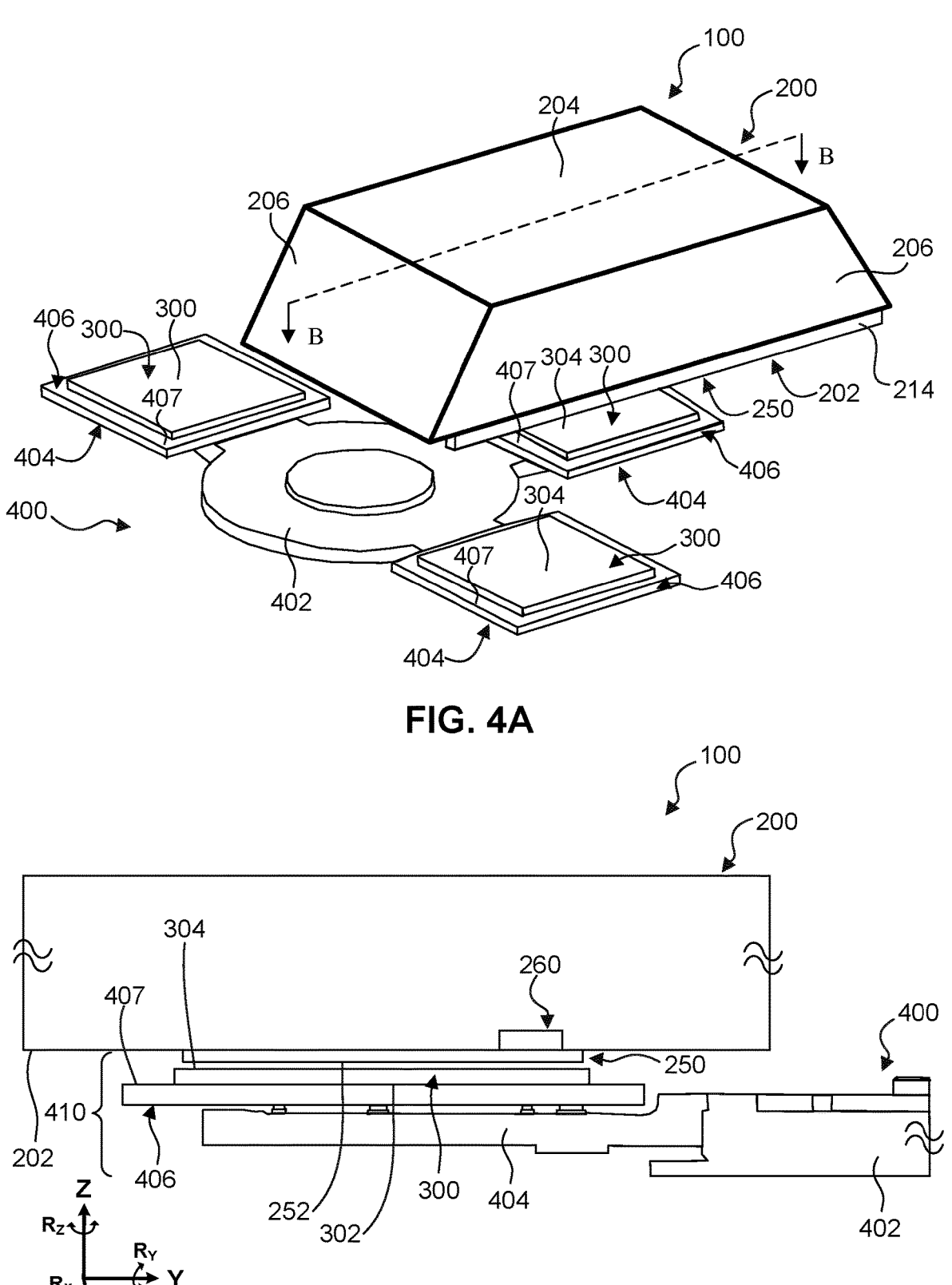
FIG. 4A is a schematic top perspective illustration of a reticle exchange apparatus, according to an exemplary aspect.
FIG. 4B is a schematic partial cross-sectional illustration of the reticle exchange apparatus shown in FIG. 4A.

FIGS. 4A and 4B show schematic illustrations of reticle exchange apparatus 100, according to exemplary aspects. FIG. 4A is a schematic top perspective illustration of reticle exchange apparatus 100, according to an exemplary aspect. FIG. 4B is a schematic partial cross-sectional illustration of reticle exchange apparatus 100 shown in FIG. 4A.

Reticle exchange apparatus 100 can be configured to reduce reticle exchange time and thermal stresses in reticle 300 to increase overall throughput, for example, in lithographic apparatus LA. In some aspects, reticle exchange apparatus 100 can reduce stress in reticle 300 by removing reticle 300 from reticle stage 200 to in-vacuum robot (IVR) 400. For example, reticle exchange apparatus 100 can quickly unclamp reticle 300 from reticle cages 224 and clamp 250 and transfer reticle 300 to IVR 400 to release thermal stress in reticle 300. In some aspects, reticle exchange apparatus 100 can reduce stress in reticle 300 and increase throughput by unclamping and transferring reticle 300 from reticle stage 200 to IVR 400 and quickly returning and clamping reticle 300 back to reticle stage 200. As shown in FIGS. 4A and 4B, reticle exchange apparatus 100 can include reticle stage 200, clamp 250, and IVR 400.

IVR 400 can include reticle handler 402 with one or more reticle handler arms 404. In some aspects, reticle handler 402 can be a rapid exchange device (RED), which is configured to efficiently rotate and minimize reticle exchange time. Reticle handler arm 404 can include reticle baseplate 406 configured to hold an object, for example, reticle 300. In some aspects, reticle baseplate 406 can be an extreme ultraviolet inner pod (EIP) for reticle 300. Reticle baseplate 406 includes reticle baseplate frontside 407, and reticle 300 includes reticle backside 304.

As shown in FIGS. 4A and 4B, reticle baseplate 406 can hold reticle 300 such that reticle baseplate frontside 407 and reticle backside 304 each face bottom stage surface 202 and clamp frontside 252. For example, reticle baseplate frontside 407 and reticle backside 304 can be facing perpendicularly away from bottom stage surface 202 and clamp frontside 252. As shown in FIG. 4B, reticle exchange apparatus 100 can include reticle exchange area 410, which is the cross-sectional area between clamp 250, reticle 300, reticle baseplate 406, and reticle handler arm 404 during a reticle exchange process.

In one example, during a reticle exchange process, reticle handler arm 404 of reticle handler 402 positions reticle 300 on reticle baseplate 406 towards clamp 250 in reticle exchange area 410. As described above, a reticle handoff from reticle handler 402 to clamp 250 and vice-versa can release thermal stress in reticle 300 and reduce parasitic thermal effects in reticle 300.

Exemplary Reticle Calibration Methods

As discussed above, a lithographic apparatus (e.g., lithographic apparatus LA) can include a reticle stage (e.g., support structure MT, reticle stage 200) to hold a patterning device (e.g., patterning device MA, reticle 300) to transfer a pattern to a substrate (e.g., substrate W). Reticle heating and/or cooling can cause changes in reticle properties that can affect the radiation beam path (e.g., focus) and cause distortions in the patterned substrate (e.g., overlay errors). Changes in reticle properties can be modeled and corrected with a reticle heating model. Current reticle heating models rely on a sensor-based application specific approach to calibrate the reticle heating model with an RTS and require a calibration lot of production wafers.

In some examples, this approach can be inaccurate and inefficient since the RTS can exhibit errors, can introduce unnecessary delays, and can require rework of production wafers. In some aspects, the RTS has a temperature gradient variation of about ±0.6° C., which can cause an overlay mismatch of about 1 nm/° C. Also, in some aspects each reticle temperature measurement with the RTS takes about five seconds per wafer, which can introduces additional delays. In addition, in some aspects, pre-conditioning of the reticle in an internal reticle library (IRL) can take additional time to condition (e.g., cool) the reticle to a desired temperature (e.g., 22° C.±0.2° C.) and some reticles can be kept in the IRL for longer than needed. For example, a delay of up to seven minutes can occur each time due to pre-conditioning delays, which can translate to a production loss of up to thirty-five production wafers per occurrence. Further, variations in a reticle's thermo-mechanical properties prior to calibration can amplify and exacerbate an overlay mismatch (e.g., increase from 1 nm/° C. to over 2.1 nm/° C.). In addition, production wafers used for calibration may be reworked over time, which can introduce additional delays and reduce overall throughput.

Aspects of reticle calibration apparatuses, systems, and methods as discussed below can increase calibration accuracy and speed of a reticle heating model, reduce conditioning times of a reticle, reduce stress in the reticle, avoid rework of production substrates, and/or increase fabrication throughput and yield of a lithographic process.

Figure 5:
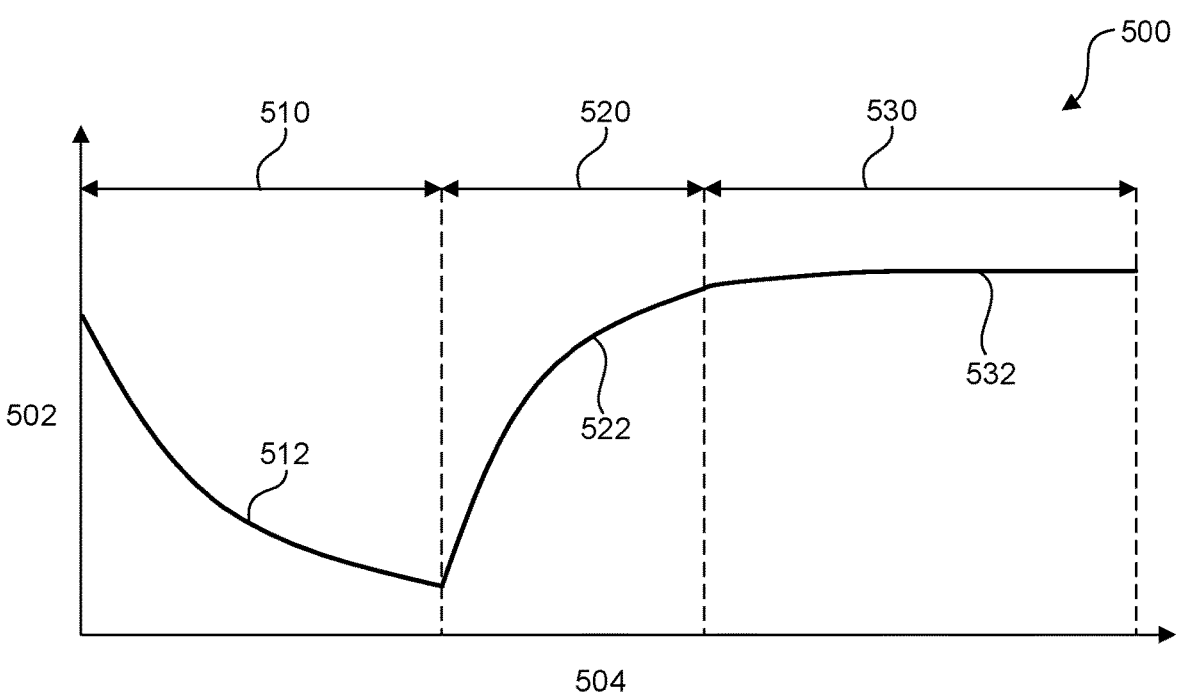
FIGS. 5 and 6 are schematic illustrations of reticle calibration methods, according to exemplary aspects.
Figure 6:
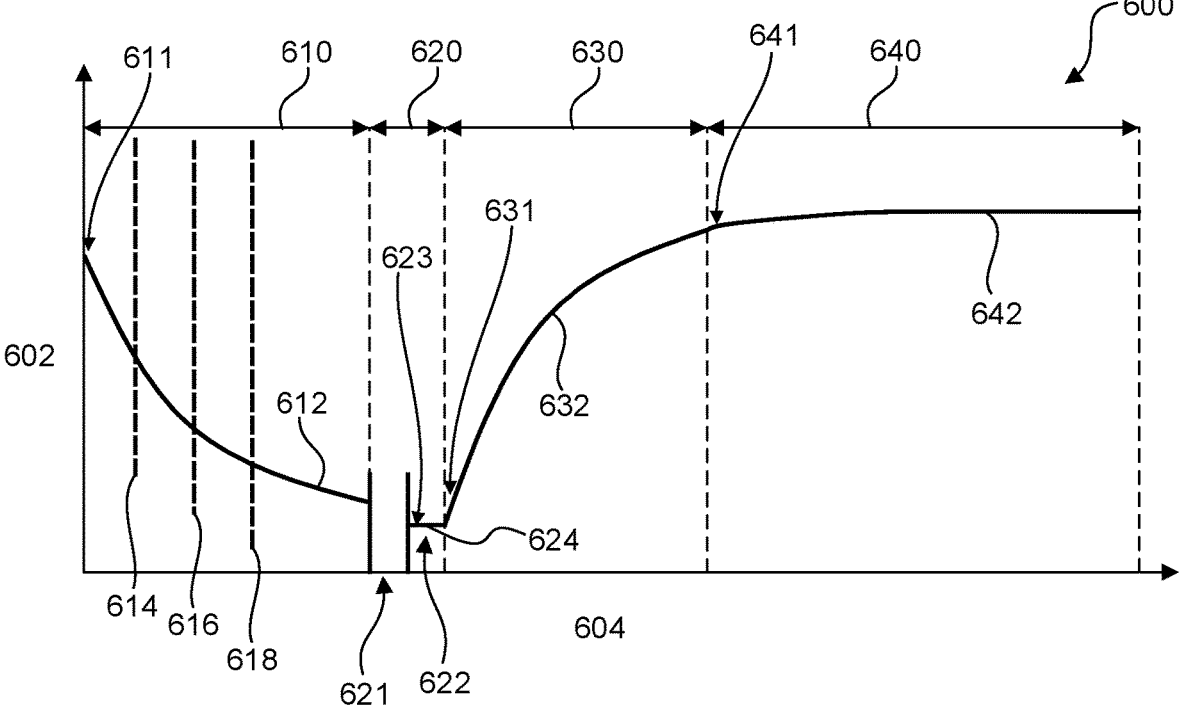
Figure 7:
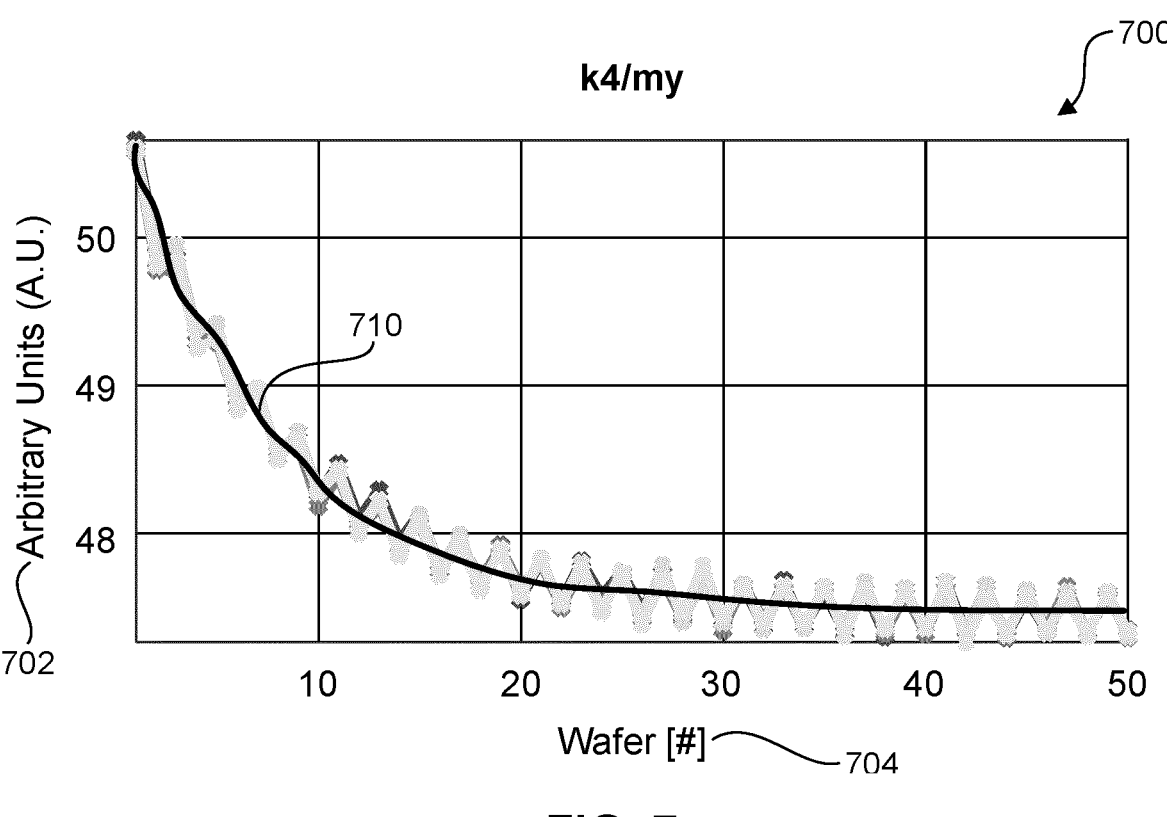
FIGS. 7 and 8 are schematic illustrations of k-parameters for the reticle calibration methods shown in FIGS. 5 and 6, according to exemplary aspects.
Figure 8:
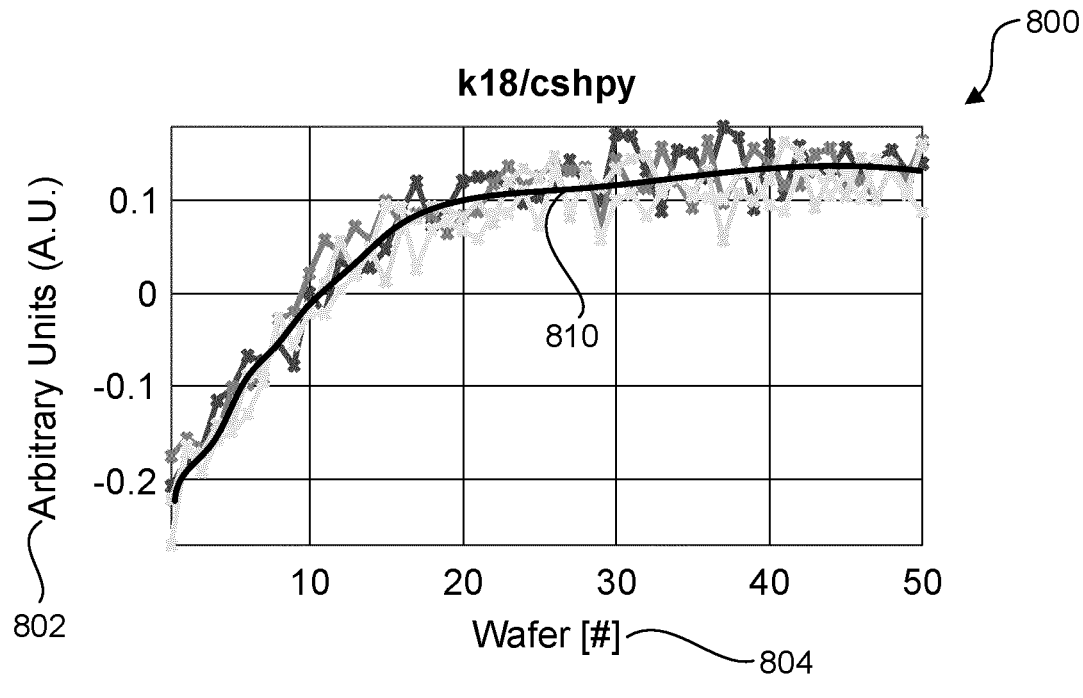

FIGS. 5-8 illustrate reticle calibration methods 500, 600, according to various exemplary aspects. FIG. 5 is a schematic illustration of reticle calibration method 500, according to an exemplary aspect. FIG. 6 is a schematic illustration of reticle calibration method 600, according to an exemplary aspect. FIG. 7 is schematic illustration of k4-parameter 700 for reticle calibration method 600 shown in FIG. 6, according to an exemplary aspect. FIG. 8 is schematic illustration of k18-parameter 800 for reticle calibration method 600 shown in FIG. 6, according to an exemplary aspect.

FIG. 5 illustrates reticle calibration method 500, according to an exemplary aspect. Reticle calibration method 500 can be configured to reduce effects of heating and/or cooling reticle 300 in a lithographic process. Reticle calibration method 500 can be further configured to increase calibration accuracy and speed of a reticle heating model and increase fabrication throughput and yield of the lithographic process. Although reticle calibration method 500 is shown in FIG. 5 as a stand-alone method and/or system, the aspects of this disclosure can be used with other apparatuses, systems, and/or methods, such as, but not limited to, lithographic apparatus LA, lithographic cell LC, computer system CL, metrology tool MT, support structure MT, patterning device MA, reticle exchange apparatus 100, reticle stage 200, reticle 300, IVR 400, and/or reticle calibration method 600.

As shown in FIG. 5, reticle calibration method 500 can include reticle temperature 502, process flow 504, conditioning phase 510, calibrating phase 520, and/or processing phase 530. Conditioning phase 510 can be configured to adjust an initial temperature of reticle 300 to a predetermined temperature. In one aspect, the initial temperature of reticle 300 can be in a range of about 20° C. to about 24° C., depending on where reticle 300 comes from in the lithography system (e.g., IRL, outside metrology tool MT, reticle stage 200, integrated reticle inspection system (IRIS), etc.). For example, reticle 300 can initially be in a "hot" state (e.g., reticle temperature greater than 22° C.±0.2° C.), a "cold" state (e.g., reticle temperature less than 22° C.±0.2° C.), and a "perfectly-conditioned" state (e.g., reticle temperature is 22° C.±0.2° C.). In one aspect, conditioning phase 510 cools and/or heats reticle 300 to the predetermined temperature (e.g., 22° C.±0.2° C.), as shown by conditioning reticle temperature 512.

In some aspects, reticle 300 can be conditioned (e.g., heated and/or cooled) by the IRL. For example, reticle 300 can be placed in the IRL for about forty minutes to reach the predetermined temperature (e.g., 22° C.±0.2° C.). In some aspects, reticle 300 can be conditioned (e.g., heated and/or cooled) by a conditioning slot that rapidly heats and/or cools reticle 300 to the predetermined temperature (e.g., 22° C.±0.2° C.). For example, the conditioning slot can include resistive heaters and/or nozzles to flow gas (e.g., air, nitrogen, argon, helium, etc.) over reticle 300 to rapidly heat and/or cool reticle 300 to the predetermined temperature (e.g., 22° C.±0.2° C.), for example, for about five minutes for an initial temperature of about 22° C.±2° C.

In some aspects, conditioning phase 510 can include an RA measurement and/or an RSD measurement to determine when reticle 300 has reached the predetermined temperature (e.g., 22° C.±0.2° C.). For example, one or more alignment marks 310 and/or one or more edge alignment marks 320 on reticle 300 can be measured to determine conditioning reticle temperature 512. In some aspects, the RSD measurement can be converted to conditioning reticle temperature 512 through an FEM. In some aspects, conditioning phase 510 can include RA measurements between reticle 300 and a non-production substrate. For example, the non-production substrate can include one or more CTC wafers for alignment and/or reticle temperature calibration.

In some aspects, conditioning phase 510 can include conditioning reticle 300 in reticle stage 200 by using a fixed amount of production substrates to determine when reticle 300 has reached the predetermined temperature (e.g., 22° C.±0.2° C.). For example, if reticle 300 is a "hot" state (e.g., reticle temperature greater than 22° C.±0.2° C.) a maximum of about forty or less production substrates (e.g., about twenty-two to about twenty-six wafers) are needed to condition the production lot, whereas if reticle 300 is near the "perfectly-conditioned" state (e.g., 22° C.±0.2° C.) a minimum of about two or more production substrates (e.g., about two to about six wafers) are needed to condition the production lot.

In some aspects, conditioning phase 510 can include conditioning reticle 300 in reticle stage 200 by using decision-based and/or machine learning to determine when reticle 300 has reached the predetermined temperature (e.g., 22° C.±0.2° C.). For example, the decision-based and/or machine learning can include using a regression, a local regression, a non-parametric local regression, a kernel regression, a multivariate adaptive regression, regression trees, a Gaussian process regression, a support vector regression, splines, smoothing splines, nearest neighbors, a neural network, an adaptive window, Kalman filtering, a linear quadratic estimation, or a combination thereof.

In some aspects, conditioning phase 510 can include conditioning reticle 300 in reticle stage 200 by using KPIs based on RA and/or RSD measurements to determine when reticle 300 has reached the predetermined temperature (e.g., 22° C.±0.2° C.). For example, as shown in FIGS. 7 and 8, k4-parameter 700 and/or k18-parameter 800 can be measured and the convergence of average k4-parameter 710 and/or average k18-parameter 810 (e.g., convergence ≥90%) can be used to determine the temperature of reticle 300 and/or calibration of a reticle heating model.

Calibrating phase 520 can be configured to calibrate a reticle heating model by exposing reticle 300 and a non-production substrate to a dose of radiation. In one aspect, the initial temperature of reticle 300 at the start of calibrating phase 520 is the predetermined temperature (e.g., 22° C.±0.2° C.) in the "perfectly-conditioned" state. In one aspect, calibrating phase 520 further heats reticle 300 to a dose production temperature (e.g., greater than 22° C.±0.2° C.) in the "hot" state, as shown in calibrating reticle temperature 522. In one aspect, during calibrating phase 520, non-production substrates are exposed with a dose of radiation to allow inline calibration of the reticle heating model in the production environment itself. In one aspect, an initial estimate of parameters (e.g., x) that need to be calibrated is conducted, based on the reticle heating model (e.g., FEM) and reticle temperature (e.g., calibrating reticle temperature 522).

In some aspects, the initial estimate of parameters for the reticle heating model can be based on calibration (e.g., RA measurement) of one or more non-production substrates (e.g., CTC wafers). For example, the reticle heating model can be evaluated for one or more non-production substrates, for example, until a convergence of parameters (e.g., convergence ≥90%) in the reticle heating model is reached. In some aspects, once calibration of the reticle heating model is completed by one or more non-production substrates, production substrates in a production lot are started and calibration based on RA measurements is continued throughout processing phase 530.

In some aspects, calibrating phase 520 can include an RA measurement and/or an RSD measurement to determine the temperature of reticle 300. In some aspects, calibrating phase 520 can include inline real-time calibration of the reticle heating model based on one or more non-production substrates and/or one or more non-production lots. For example, reticle temperature in a particular phase (e.g., conditioning phase 510) can be compared between two different non-production substrates and/or non-production lots and the difference (e.g., differential reticle temperature ΔT) or trend (e.g., ΔT=0.5° C.) can be adjusted in the reticle heating model.

In some aspects, calibrating phase 520 can include evaluating the reticle heating model for each RA measurement between the reticle and a plurality of non-production substrates in a non-production lot. For example, the evaluating can include updating a parameter x (e.g., radiation dose, focus, alignment, etc.) of the lithographic process by the following:

$$x_{new} = x_{old} + \gamma \cdot (x_{old} - RA_{results})$$

where $\gamma$ is a gain value and configured to filter out noise. For example, $\gamma$ can be equal to any number within the interval [−1, 1] (e.g., −1, −0.5, −0.1, 0.1, 0.5, 1). For example, the evaluating can include an RA measurement of each of the plurality of non-production substrates until a convergence (e.g., ≥90%) is reached.

In some aspects, calibrating phase 520 can be further configured to acclimate (e.g., heat) reticle 300 to a dose temperature by exposing reticle 300 and a non-production substrate to a dose of radiation. In one aspect, the initial temperature of reticle 300 at the start of calibrating phase 520 is the predetermined temperature (e.g., 22° C.±0.2° C.) in the "perfectly-conditioned" state. In one aspect, calibrating phase 520 heats reticle 300 to a dose temperature (e.g., about 24° C.), as shown in calibrating reticle temperature 522. In some aspects, calibrating phase 520 can include an RA measurement and/or an RSD measurement to determine the temperature of reticle 300. In some aspects, the non-production substrate can include one or more CTC wafers for dose calibration.

Processing phase 530 can be configured to process (e.g., fabricate) a production substrate by exposing reticle 300 and the production substrate to a dose of radiation based on the reticle heating model. In one aspect, the initial temperature of reticle 300 at the start of processing phase 530 is the dose temperature (e.g., about 24° C.). In one aspect, processing phase 530 further heats reticle 300 to a dose production temperature (e.g., ≥24° C.) in the "hot" state, as shown in processing reticle temperature 532. In one aspect, during processing phase 530, production substrates are exposed with a dose of radiation to allow inline calibration of the reticle heating model in the production environment itself. In one aspect, an initial estimate of parameters (e.g., x) that need to be calibrated is conducted, based on the reticle heating model (e.g., FEM) and reticle temperature (e.g., processing reticle temperature 532).

In some aspects, processing phase 530 can be further configured to calibrate the reticle heating model by exposing reticle 300 and a production substrate to a dose of radiation. In some aspects, once calibration of the reticle heating model is completed by one or more non-production substrates (e.g., during calibrating phase 520), production substrates in a production lot are started and calibration based on RA measurements is continued throughout processing phase 530.

In some aspects, processing phase 530 can include an RA measurement and/or an RSD measurement to determine the temperature of reticle 300. In some aspects, processing phase 530 can include inline real-time calibration of the reticle heating model based on one or more production substrates and/or one or more production lots. For example, reticle temperature in a particular phase (e.g., conditioning phase 510) can be compared between two different production substrates and/or production lots and the difference (e.g., differential reticle temperature ΔT) or trend (e.g., ΔT=0.5° C.) can be adjusted in the reticle heating model.

In some aspects, processing phase 530 can include evaluating the reticle heating model for each RA measurement between the reticle and a plurality of production substrates in a production lot. For example, the evaluating can include updating a parameter x (e.g., radiation dose, focus, alignment, etc.) of the lithographic process by the following:

$$x_{new} = x_{old} + \gamma \cdot (x_{old} - RA_{results})$$

where $\gamma$ is a gain value and configured to filter out noise. For example, $\gamma$ can be equal to any number within the interval [−1, 1] (e.g., −1, −0.5, −0.1, 0.1, 0.5, 1). For example, the evaluating can include an RA measurement of each of the plurality of production substrates until a convergence (e.g., ≥90%) is reached.

In some aspects, reticle calibration method 500 can include performing separate RA and RSD measurements for each phase (e.g., in conditioning phase 510, calibrating phase 520, and processing phase 530). For example, RA measurements can be conducted in each phase, and RSD measurements can be conducted just once in each phase. In some aspects, the decision-based and/or machine learning used in conditioning phase 510 to determine the temperature of reticle 300 can also be used in calibrating phase 520 and/or processing phase 530.

In some aspects, reticle calibration method 500 can be implemented by computer system CL, which can act as a controller and/or a processor to control the various phases and measurements of reticle calibration method 500. In some aspects, reticle calibration method 500 can be implemented by lithographic apparatus LA, which can include a controller and/or a processor to control the various phases and measurements of reticle calibration method 500. In some aspects, reticle calibration method 500 can be implemented by a non-transitory computer readable medium program, for example, on computer system CL, which can act as a controller and/or a processor to control the various phases and measurements of reticle calibration method 500.

The aspects of reticle calibration method 500 shown in FIG. 5, for example, and the aspects of reticle calibration method 600 shown in FIG. 6 may be similar. Similar reference numbers are used to indicate features of the aspects of reticle calibration method 500 shown in FIG. 5 and the similar features of the aspects of reticle calibration method 600 shown in FIG. 6.

FIG. 6 illustrates reticle calibration method 600, according to an exemplary aspect. Reticle calibration method 600 can be configured to reduce effects of heating and/or cooling reticle 300 in a lithographic process. Reticle calibration method 600 can be further configured to increase calibration accuracy and speed of a reticle heating model and increase fabrication throughput and yield of the lithographic process. Although reticle calibration method 600 is shown in FIG. 6 as a stand-alone method and/or system, the aspects of this disclosure can be used with other apparatuses, systems, and/or methods, such as, but not limited to, lithographic apparatus LA, lithographic cell LC, computer system CL, metrology tool MT, support structure MT, patterning device MA, reticle exchange apparatus 100, reticle stage 200, reticle 300, IVR 400, and/or reticle calibration method 500.

As shown in FIG. 6, reticle calibration method 600 can include reticle temperature 602, process flow 604, conditioning phase 610, stress reducing phase 620, calibrating phase 630, and/or processing phase 640. Conditioning phase 610 can be configured to adjust an initial temperature of reticle 300 to a predetermined temperature. In one aspect, the initial temperature of reticle 300 can be in a range of about 20° C. to about 24° C., depending on where reticle 300 comes from in the lithography system (e.g., IRL, outside metrology tool MT, reticle stage 200, IRIS, etc.). For example, reticle 300 can initially be in a "hot" state (e.g., reticle temperature greater than 22° C.±0.2° C.), a "cold" state (e.g., reticle temperature less than 22° C.±0.2° C.), and a "perfectly-conditioned" state (e.g., reticle temperature is 22° C.±0.2° C.). In one aspect, conditioning phase 610 can include conditioning RA and RSD measurement 611 to determine an initial temperature of reticle 300. In one aspect, conditioning phase 610 cools and/or heats reticle 300 to the predetermined temperature (e.g., 22° C.±0.2° C.), as shown in FIG. 6 by conditioning reticle temperature 612.

In some aspects, reticle 300 can be conditioned (e.g., heated and/or cooled) by the IRL. For example, reticle 300 can be placed in the IRL for about forty minutes to reach the predetermined temperature (e.g., 22° C.±0.2° C.). In some aspects, reticle 300 can be conditioned (e.g., heated and/or cooled) by a conditioning slot that rapidly heats and/or cools reticle 300 to the predetermined temperature (e.g., 22° C.±0.2° C.). For example, the conditioning slot can include resistive heaters and/or nozzles to flow gas (e.g., air, nitrogen, argon, helium, etc.) over reticle 300 to rapidly heat and/or cool reticle 300 to the predetermined temperature (e.g., 22° C.±0.2° C.), for example, for about five minutes for an initial temperature of about 22° C.±2° C.

In some aspects, conditioning phase 610 can include one or more RA measurements and an RSD measurement to determine when reticle 300 has reached the predetermined temperature (e.g., 22° C.±0.2° C.). For example, as shown in FIG. 6, conditioning RA and RSD measurement 611 can be conducted to determine an initial temperature of reticle 300 in conditioning phase 610. For example, one or more alignment marks 310 (shown in FIGS. 3A and 3B) and one or more edge alignment marks 320 (shown in FIGS. 3A and 3B) on reticle 300 can be measured to determine conditioning reticle temperature 612. In some aspects, the RSD measurement can be converted to conditioning reticle temperature 612 through an FEM. In some aspects, conditioning phase 610 can include one or more RA measurements between reticle 300 and a non-production substrate. For example, as shown in FIG. 6, conditioning phase 610 can include conditioning RA and RSD measurement 611, second conditioning RA measurement 614 (if needed), third conditioning RA measurement 616 (if needed), and/or fourth conditioning RA measurement 618 (if needed) to measure reticle temperature 602 periodically during process flow 604 and determine when reticle 300 has reached the predetermined temperature (e.g., 22° C.±0.2° C.). For example, the non-production substrate can include one or more CTC wafers for alignment and/or reticle temperature calibration.

In some aspects, conditioning phase 610 can include conditioning reticle 300 in reticle stage 200 by using a fixed amount of production substrates to determine when reticle 300 has reached the predetermined temperature (e.g., 22° C.±0.2° C.). For example, if reticle 300 is in a "hot" state (e.g., reticle temperature greater than 22° C.±0.2° C.) a maximum of about forty or less production substrates (e.g., about twenty-two to about twenty-six wafers) are needed to condition the production lot, whereas if reticle 300 is near the "perfectly-conditioned" state (e.g., 22° C.±0.2° C.) a minimum of about two or more production substrates (e.g., about two to about six wafers) are needed to condition the production lot.

In some aspects, conditioning phase 610 can include conditioning reticle 300 in reticle stage 200 by using decision-based and/or machine learning to determine when reticle 300 has reached the predetermined temperature (e.g., 22° C.±0.2° C.). For example, the decision-based and/or machine learning can include using a regression, a local regression, a non-parametric local regression, a kernel regression, a multivariate adaptive regression, regression trees, a Gaussian process regression, a support vector regression, splines, smoothing splines, nearest neighbors, a neural network, an adaptive window, Kalman filtering, a linear quadratic estimation, or a combination thereof. In some aspects, the timing specifications (e.g., applied Kalman filtering) are aligned with the timing specification of the lithographic process (e.g., process window) with similar high accuracy. In some aspects, an adaptive window can be used to determine whether there is any decay and/or drift of KPIs (e.g., k4-parameter, k18-parameter). For example, four RA measurements can be conducted (e.g., past three measurements and current measurement) and a check can be performed to verify whether any variation between the RA measurements has occurred. If a variation is detected, conditioning phase 610 continues, whereas if no variation is detected, conditioning phase 610 is completed (e.g., stopped). In some aspects, a minimum time of conditioning phase 610 is about one minute and a maximum time of conditioning phase 610 is about five minutes.

In some aspects, conditioning phase 610 can include conditioning reticle 300 in reticle stage 200 by using KPIs based on RA and/or RSD measurements to determine when reticle 300 has reached the predetermined temperature (e.g., 22° C.±0.2° C.). For example, as shown in FIGS. 7 and 8, k4-parameter 700 and/or k18-parameter 800 can be measured and the convergence of average k4-parameter 710 and/or average k18-parameter 810 (e.g., convergence ≥90%) can be used to determine the temperature of reticle 300 and/or calibration parameters of a reticle heating model. For example, as shown in FIG. 6, conditioning phase 610 can include conditioning RA and RSD measurement 611, second conditioning RA measurement 614, third conditioning RA measurement 616, and/or fourth conditioning RA measurement 618 to measure KPIs (e.g., k4-parameter 700, k18-parameter 800) to determine when reticle 300 has reached the predetermined temperature (e.g., 22° C.±0.2° C.).

Stress reducing phase 620 can be configured to reduce parasitic thermal effects in reticle 300. In one aspect, as shown in FIG. 6, stress reducing phase 620 can include removal step 621 and zero dose step 622. Removal step 621 can be configured to release stress from reticle 300 by removing reticle 300 from reticle stage 200 to IVR 400 and thereby reduce parasitic thermal effects. Zero dose step 622 can be configured to release stress from reticle 300 by exposing reticle 300 and a non-production substrate to a zero dose of radiation and thereby reduce parasitic thermal effects. In one aspect, the initial temperature of reticle 300 at the start of stress reducing phase 620 is the predetermined temperature (e.g., 22° C.±0.2° C.) in the "perfectly-conditioned" state. In one aspect, stress reducing phase 620 reduces parasitic thermal effects in reticle 300 by releasing stress in reticle 300 in removal step 621 and then exposing reticle 300 in zero dose step 622 to further reduce parasitic thermal effects, as shown in stress reducing reticle temperature 624. In one aspect, stress reducing phase 620 maintains reticle 300 at the predetermined temperature (e.g., 22° C.±0.2° C.) in the "perfectly-conditioned" state. In one aspect, zero dose step 622 can include zero dose RA and RSD measurement 623 to verify the temperature of reticle 300.

In some aspects, stress can be reduced in reticle 300 by removing reticle 300 from reticle stage 200 and quickly returning reticle 300 back to reticle stage 200. For example, as shown in FIGS. 4A and 4B, reticle 300 can be unclamped from reticle cages 224 and clamp 250 on reticle stage 200 and transferred to reticle baseplate 406 of IVR 400, and then immediately transferred back to reticle stage 200 and clamped by reticle cages 224 and clamp 250. In some aspects, stress can be reduced in reticle 300 by exposing reticle 300 and a non-production substrate (e.g., CTC wafer) to a zero dose of radiation. For example, as shown in FIG. 6, after removal step 621, zero dose step 622 can begin and reticle temperature can once again be verified (e.g., via RA and/or RSD measurements). In some aspects, stress reducing phase 620 can include an RA measurement and/or an RSD measurement to determine the temperature of reticle 300. For example, as shown in FIG. 6, zero dose RA and RSD measurement 623 can be conducted to verify an initial temperature of reticle 300 in zero dose step 622. In some aspects, the non-production substrate can include one or more CTC wafers for zero dose calibration.

Calibrating phase 630 can be configured to calibrate a reticle heating model by exposing reticle 300 and a non-production substrate to a dose of radiation. In one aspect, the initial temperature of reticle 300 at the start of calibrating phase 630 is the predetermined temperature (e.g., 22° C.±0.2° C.) in the "perfectly-conditioned" state. In one aspect, calibrating phase 630 can include calibrating RA and RSD measurement 631 to verify the temperature of reticle 300. In one aspect, calibrating phase 630 heats reticle 300 to a dose temperature (e.g., greater than 22° C.±0.2° C.), as shown in calibrating reticle temperature 632. In one aspect, during calibrating phase 630, non-production substrates are exposed with a dose of radiation to allow inline calibration of the reticle heating model in the production environment itself. In one aspect, an initial estimate of parameters (e.g., x) that need to be calibrated is conducted, based on the reticle heating model (e.g., FEM) and reticle temperature (e.g., calibrating reticle temperature 632).

In some aspects, the initial estimate of parameters for the reticle heating model can be based on calibration (e.g., RA measurement) of one or more non-production substrates (e.g., CTC wafers). For example, the reticle heating model can be evaluated for one or more non-production substrates, for example, until a convergence of parameters (e.g., convergence ≥90%) in the reticle heating model is reached. In some aspects, once calibration of the reticle heating model is completed by one or more non-production substrates, production substrates in a production lot are started and calibration based on RA measurements is continued throughout processing phase 640.

In some aspects, calibrating phase 630 can include an RA measurement and/or an RSD measurement to determine the temperature of reticle 300. For example, as shown in FIG. 6, calibrating RA and RSD measurement 631 can be conducted to verify an initial temperature of reticle 300 at the start of calibrating phase 630. In some aspects, calibrating phase 630 can include inline real-time calibration of the reticle heating model based on one or more non-production substrates and/or one or more non-production lots. For example, reticle temperature in a particular phase (e.g., conditioning phase 610) can be compared between two different non-production substrates and/or non-production lots and the difference (e.g., differential reticle temperature ΔT) or trend (e.g., ΔT=0.5° C.) can be adjusted in the reticle heating model.

In some aspects, calibrating phase 630 can include evaluating the reticle heating model for each RA measurement between reticle 300 and a plurality of non-production substrates in a non-production lot. For example, the evaluating can include updating a parameter x (e.g., radiation dose, focus, alignment, etc.) of the lithographic process by the following:

$$x_{new} = x_{old} + \gamma \cdot (x_{old} - RA_{results})$$

where $\gamma$ is a gain value and configured to filter out noise. For example, $\gamma$ can be equal to any number within the interval $[-1, 1]$ (e.g., $-1$, $-0.5$, $-0.1$, $0.1$, $0.5$, $1$). For example, the evaluating can include an RA measurement of each of the plurality of non-production substrates until a convergence (e.g., ≥90%) is reached.

In some aspects, calibrating phase 630 can be further configured to acclimate (e.g., heat) reticle 300 to a dose temperature by exposing reticle 300 and a non-production substrate to a dose of radiation. In one aspect, the initial temperature of reticle 300 at the start of calibrating phase 630 is the predetermined temperature (e.g., 22° C.±0.2° C.) in the "perfectly-conditioned" state. In one aspect, calibrating phase 630 heats reticle 300 to a dose temperature (e.g., about 24° C.), as shown in calibrating reticle temperature 632. In some aspects, calibrating phase 630 can include an RA measurement and/or an RSD measurement to determine the temperature of reticle 300. For example, as shown in FIG. 6, calibrating RA and RSD measurement 631 can be conducted to verify an initial temperature of reticle 300 in calibrating phase 630. In some aspects, the non-production substrate can include one or more CTC wafers for dose calibration.

Processing phase 640 can be configured to process (e.g., fabricate) a production substrate by exposing reticle 300 and the production substrate to a dose of radiation based on the reticle heating model. In one aspect, the initial temperature of reticle 300 at the start of processing phase 640 is the dose temperature (e.g., about 24° C.). In one aspect, processing phase 640 can include processing RA and RSD measurement 641 to verify the temperature of reticle 300. In one aspect, processing phase 640 further heats reticle 300 to a dose production temperature (e.g., ≥24° C.) in the "hot" state, as shown in processing reticle temperature 642. In one aspect, during processing phase 640, production substrates are exposed with a dose of radiation to allow inline calibration of the reticle heating model in the production environment itself. In one aspect, an initial estimate of parameters (e.g., x) that need to be calibrated is conducted, based on the reticle heating model (e.g., FEM) and reticle temperature (e.g., processing reticle temperature 642).

In some aspects, processing phase 640 can be further configured to calibrate the reticle heating model by exposing reticle 300 and a production substrate to a dose of radiation. In some aspects, once calibration of the reticle heating model is completed by one or more non-production substrates (e.g., during calibrating phase 630), production substrates in a production lot are started and calibration based on RA measurements is continued throughout processing phase 640.

In some aspects, processing phase 640 can include an RA measurement and/or an RSD measurement to determine the temperature of reticle 300. For example, as shown in FIG. 6, processing RA and RSD measurement 641 can be conducted to verify an initial temperature of reticle 300 at the start of processing phase 640. In some aspects, processing phase 640 can include inline real-time calibration of the reticle heating model based on one or more production substrates and/or one or more production lots. For example, reticle temperature in a particular phase (e.g., conditioning phase 610) can be compared between two different production substrates and/or production lots and the difference (e.g., differential reticle temperature ΔT) or trend (e.g., ΔT=0.5° C.) can be adjusted in the reticle heating model.

In some aspects, processing phase 640 can include evaluating the reticle heating model for each RA measurement between reticle 300 and a plurality of production substrates in a production lot. For example, the evaluating can include updating a parameter x (e.g., radiation dose, focus, alignment, etc.) of the lithographic process by the following:

$$x_{new} = x_{old} + \gamma \cdot (x_{old} - RA_{results})$$

where γ is a gain value and configured to filter out noise. For example, γ can be equal to any number within the interval [−1, 1] (e.g., −1, −0.5, −0.1, 0.1, 0.5, 1). For example, the evaluating can include an RA measurement of each of the plurality of production substrates until a convergence (e.g., ≥90%) is reached.

In some aspects, reticle calibration method 600 can include performing separate RA and RSD measurements for each phase (e.g., in conditioning phase 610, stress reducing phase 620, calibrating phase 630, and processing phase 640). For example, RA measurements can be conducted in each phase, and RSD measurements can be conducted just once in each phase. In some aspects, the decision-based and/or machine learning used in conditioning phase 610 to determine the temperature of reticle 300 can also be used in stress reducing phase 620, calibrating phase 630, and/or processing phase 640.

In some aspects, reticle calibration method 600 can utilize a comprehensive reticle heating model to cover all possible heating dynamics. For example, reticle calibration method 600 can avoid calibrating phase 630 by using one or more pre-determined FEM in the reticle heating model. In some aspects, reticle calibration method 600 can utilize a central data pool to calibrate the reticle heating model. For example, the central data pool can include baseline and/or statistical values (e.g., parameters of the reticle heating model) based on various internal (e.g., in-resist) data. In some aspects, reticle calibration method 600 can include sine-sweep exposures to conduct both reticle heating model calibration and lens calibration. For example, by using sine-sweep exposures (e.g., fixed period), different time constants can be extracted (e.g., with RA and/or RSD measurements) for reticle heating model parameters and lens parameters for calibration.

In some aspects, reticle calibration method 600 can be implemented by computer system CL, which can act as a controller and/or a processor to control the various phases and measurements of reticle calibration method 600. In some aspects, reticle calibration method 600 can be implemented by lithographic apparatus LA, which can include a controller and/or a processor to control the various phases and measurements of reticle calibration method 600. In some aspects, reticle calibration method 600 can be implemented by a non-transitory computer readable medium program, for example, on computer system CL, which can act as a controller and/or a processor to control the various phases and measurements of reticle calibration method 600.

FIG. 7 illustrates k4-parameter 700, according to an exemplary aspect. K4-parameter 700 can be configured to increase calibration accuracy and speed of a reticle heating model. K4-parameter 700 can be further configured to determine a temperature of reticle 300. K4-parameter 700 represents distortion in Y-axis magnification. Although k4-parameter 700 is shown in FIG. 7 as a stand-alone method and/or system, the aspects of this disclosure can be used with other apparatuses, systems, and/or methods, such as, but not limited to, lithographic apparatus LA, lithographic cell LC, computer system CL, metrology tool MT, reticle calibration method 500, and/or reticle calibration method 600.

As shown in FIG. 7, k4-parameter 700 can include intensity (arbitrary units) 702, wafer number 704, and average k4-parameter 710. In some aspects, k4-parameter 700 can be measured based on distortions in RA and/or RSD measurements to determine a temperature of reticle 300. For example, as shown in FIG. 7, average k4-parameter 710 can be measured over several wafers and the convergence (e.g., ≥90%) of average k4-parameter 710 can be used to determine the temperature of reticle 300 and/or calibration parameters of the reticle heating model of reticle calibration method 500 and/or reticle calibration method 600. In some aspects, k4-parameter 700 can be measured to determine when reticle 300 has reached a predetermined temperature (e.g., 22° C.±0.2° C.).

FIG. 8 illustrates k18-parameter 800, according to an exemplary aspect. K18-parameter 800 can be configured to increase calibration accuracy and speed of a reticle heating model. K18-parameter 800 represents distortion in Y-axis barrel shape. Although k18-parameter 800 is shown in FIG. 8 as a stand-alone method and/or system, the aspects of this disclosure can be used with other apparatuses, systems, and/or methods, such as, but not limited to, lithographic apparatus LA, lithographic cell LC, computer system CL, metrology tool MT, reticle calibration method 500, and/or reticle calibration method 600.

As shown in FIG. 8, k18-parameter 800 can include intensity (arbitrary units) 802, wafer number 804, and average k18-parameter 810. In some aspects, k18-parameter 800 can be measured based on distortions in RA and/or RSD measurements to determine a temperature of reticle 300. For example, as shown in FIG. 8, average k18-parameter 810 can be measured over several wafers and the convergence (e.g., ≥90%) of average k18-parameter 810 can be used to determine the temperature of reticle 300 and/or calibration parameters of the reticle heating model of reticle calibration method 500 and/or reticle calibration method 600. In some aspects, k18-parameter 800 can be measured to determine when reticle 300 has reached a predetermined temperature (e.g., 22° C.±0.2° C.).

Exemplary Reticle Calibration Diagrams

Figure 9:
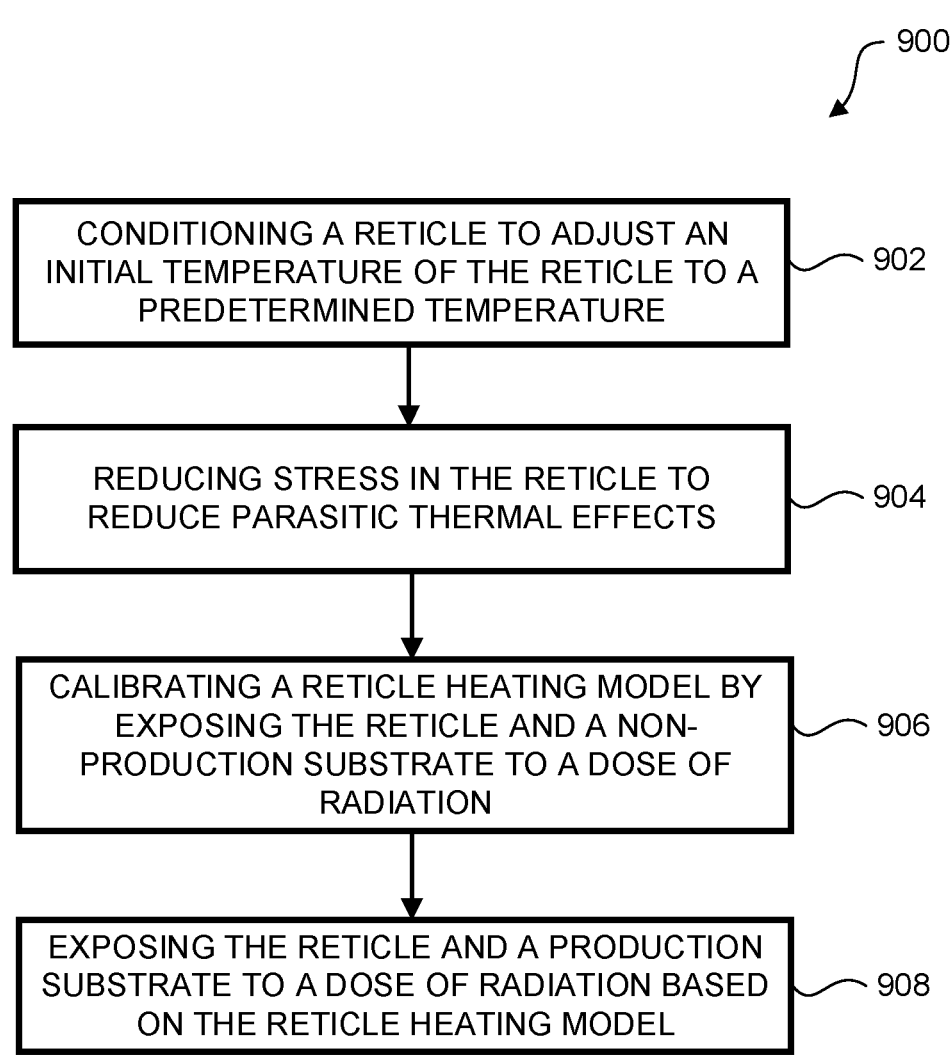
FIGS. 9 and 10 illustrate reticle calibration diagrams, according to exemplary aspects.
Figure 10:
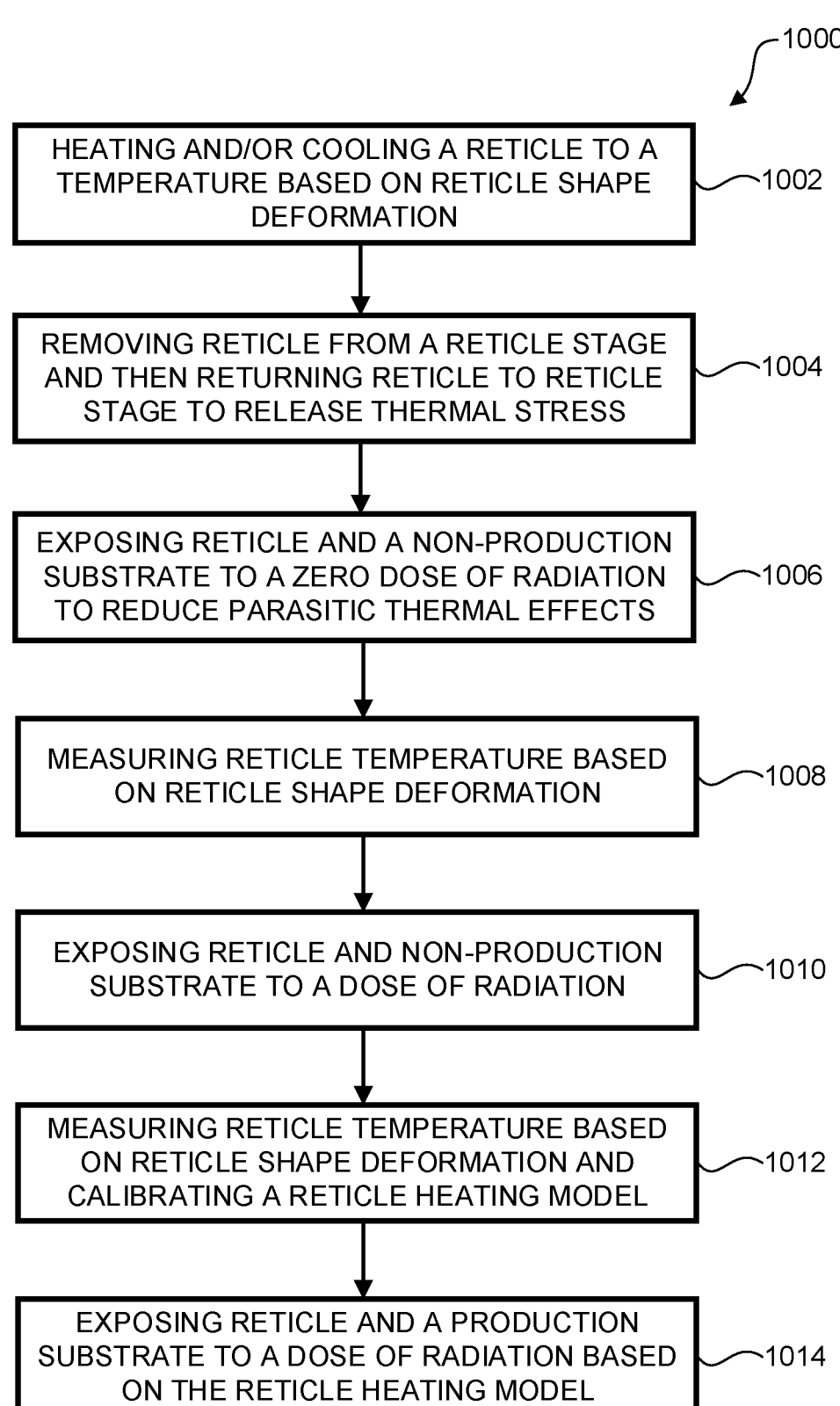

FIGS. 9 and 10 illustrate reticle calibration diagrams 900, 1000 for reducing effects of heating and/or cooling reticle 300 in a lithographic process, according to exemplary aspects. FIG. 9 illustrates reticle calibration diagram 900, according to an exemplary aspect. It is to be appreciated that not all steps in FIG. 9 are needed to perform the disclosure provided herein. Further, some of the steps may be performed simultaneously, sequentially, and/or in a different order than shown in FIG. 9. Reticle calibration diagram 900 shall be described with reference to FIGS. 3A, 3B, 4A, 4B, 5 and 6. However, reticle calibration diagram 900 is not limited to those example aspects.

In step 902, as shown in the example of FIGS. 3A, 3B, 5, and 6, reticle 300 is conditioned (e.g., heated and/or cooled) to adjust an initial temperature of reticle 300 to a predetermined temperature (e.g., 22° C.±0.2° C.). In some aspects, reticle 300 can be conditioned (e.g., heated and/or cooled) by a conditioning slot that rapidly heats and/or cools reticle 300 to the predetermined temperature (e.g., 22° C.±0.2° C.). In some aspects, one or more RA measurements and an RSD measurement can be conducted to determine when reticle 300 has reached the predetermined temperature (e.g., 22° C.±0.2° C.). In some aspects, decision-based and/or machine learning can be used to determine when reticle 300 has reached the predetermined temperature (e.g., 22° C.±0.2° C.).

In step 904, as shown in the example of FIGS. 3A, 3B, 4A, 4B, and 6, stress in reticle 300 is reduced (e.g., released) and parasitic thermal effects in reticle 300 are reduced. In some aspects, stress in reticle 300 can be released by removing reticle 300 from reticle stage 200 to IVR 400 and thereby reduce parasitic thermal effects. In some aspects, stress in reticle 300 can be released by exposing reticle 300 and a non-production substrate to a zero dose of radiation and thereby reduce parasitic thermal effects.

In step 906, as shown in the example of FIGS. 3A, 3B, 5, and 6, a reticle heating model is calibrated by exposing reticle 300 and a non-production substrate to a dose of radiation. In some aspects, an initial estimate of parameters for the reticle heating model can be based on calibration (e.g., RA measurement) of one or more non-production substrates (e.g., CTC wafers). In some aspects, an RA measurement and/or an RSD measurement can be conducted to determine the temperature of reticle 300. In some aspects, inline real-time calibration of the reticle heating model can be based on one or more non-production substrates and/or one or more non-production lots. In some aspects, the reticle heating model can be evaluated for each RA measurement between reticle 300 and a plurality of non-production substrates in a non-production lot.

In some aspects, during step 906, reticle 300 is acclimated (e.g., heated) by exposing reticle 300 and a non-production substrate to a dose of radiation. In some aspects, an RA measurement and/or an RSD measurement can be conducted to determine the temperature of reticle 300. In some aspects, the non-production substrate can include one or more CTC wafers for dose calibration.

In step 908, as shown in the example of FIGS. 3A, 3B, 5, and 6, a production substrate is processed (e.g., fabricated) by exposing reticle 300 and the production substrate to a dose of radiation based on the reticle heating model. In some aspects, an RA measurement and/or an RSD measurement can be conducted to determine the temperature of reticle 300. In some aspects, inline real-time calibration of the reticle heating model can be based on one or more production substrates and/or one or more production lots. In some aspects, the reticle heating model can be evaluated for each RA measurement between reticle 300 and a plurality of production substrates in a production lot.

FIG. 10 illustrates reticle calibration diagram 1000, according to an exemplary aspect. It is to be appreciated that not all steps in FIG. 10 are needed to perform the disclosure provided herein. Further, some of the steps may be performed simultaneously, sequentially, and/or in a different order than shown in FIG. 10. Reticle calibration diagram 1000 shall be described with reference to FIGS. 3A, 3B, 4A, 4B, 5 and 6. However, reticle calibration diagram 1000 is not limited to those example aspects.

In step 1002, as shown in the example of FIGS. 3A, 3B, 5, and 6, reticle 300 is heated and/or cooled to a temperature (e.g., 22° C.±0.2° C.) based on an RSD measurement. In some aspects, the RSD measurement can be converted to reticle temperature through an FEM. In some aspects, reticle 300 can be heated and/or cooled by a conditioning slot that rapidly heats and/or cools reticle 300. In some aspects, one or more RA measurements and an RSD measurement can be conducted to determine when reticle 300 has reached a predetermined temperature (e.g., 22° C.±0.2° C.). In some aspects, decision-based and/or machine learning can be used to determine when reticle 300 has reached a predetermined temperature (e.g., 22° C.±0.2° C.).

In step 1004, as shown in the example of FIGS. 3A, 3B, 4A, 4B, and 6, reticle 300 is removed from reticle stage 200 and then returned to reticle stage 200 to release thermal stress. In some aspects, stress in reticle 300 (e.g., induced stress, internal strain) can be released by removing reticle 300 from reticle stage 200 to IVR 400 and quickly returning reticle 300 from IVR 400 to reticle stage 200, thereby reducing parasitic thermal effects.

In step 1006, as shown in the example of FIGS. 3A, 3B, and 6, reticle 300 and a non-production substrate are exposed to a zero dose of radiation to reduce parasitic thermal effects. In some aspects, stress in reticle 300 (e.g., residual stress) can be released and/or relaxed by exposing reticle 300 and a non-production substrate (e.g., CTC wafer) to a zero dose of radiation, thereby reducing parasitic thermal effects.

In step 1008, as shown in the example of FIGS. 3A, 3B, 5, and 6, temperature of reticle 300 is measured based on an RSD measurement. In some aspects, an RA measurement and/or an RSD measurement can be conducted to determine the temperature of reticle 300.

In step 1010, as shown in the example of FIGS. 3A, 3B, 5, and 6, reticle 300 and a non-production substrate are exposed to a dose of radiation. In some aspects, an RA measurement and/or an RSD measurement can be conducted to determine the temperature of reticle 300. In some aspects, the non-production substrate can include one or more CTC wafers for dose calibration.

In step 1012, as shown in the example of FIGS. 3A, 3B, 5, and 6, temperature of reticle 300 is measured based on an RSD measurement and a reticle heating model is calibrated based on the measured temperature of reticle 300. In some aspects, an RA measurement and/or an RSD measurement can be conducted to determine the temperature of reticle 300. In some aspects, an initial estimate of parameters for the reticle heating model can be based on calibration (e.g., RA measurement) of one or more non-production substrates (e.g., CTC wafers). In some aspects, an RA measurement and/or an RSD measurement can be conducted to determine the temperature of reticle 300. In some aspects, inline real-time calibration of the reticle heating model can be based on one or more non-production substrates and/or one or more non-production lots. In some aspects, the reticle heating model can be evaluated for each RA measurement between reticle 300 and a plurality of non-production substrates in a non-production lot.

In step 1014, as shown in the example of FIGS. 3A, 3B, 5, and 6, a production substrate is processed (e.g., fabricated) by exposing reticle 300 and the production substrate to a dose of radiation based on the reticle heating model. In some aspects, an RA measurement and/or an RSD measurement can be conducted to determine the temperature of reticle 300. In some aspects, inline real-time calibration of the reticle heating model can be based on one or more production substrates and/or one or more production lots. In some aspects, the reticle heating model can be evaluated for each RA measurement between reticle 300 and a plurality of production substrates in a production lot.

The embodiments may further be described using the following clauses:

1. A method comprising:
   conditioning a reticle to adjust an initial temperature of the reticle to a predetermined temperature;
   reducing stress in the reticle to reduce parasitic thermal effects;
   calibrating a reticle heating model by exposing the reticle and a non-production substrate to a dose of radiation; and
   processing a production substrate by exposing the reticle and the production substrate to a dose of radiation based on the reticle heating model.

2. The method of clause 1, wherein the conditioning comprises measuring a reticle alignment between the reticle and the non-production substrate to determine when the reticle has reached the predetermined temperature.

3. The method of clause 2, wherein the measuring the reticle alignment is based on one or more alignment marks on the reticle.

4. The method of clause 1, wherein the conditioning comprises measuring a reticle shape deformation of the reticle to determine when the reticle has reached the predetermined temperature.

5. The method of clause 4, wherein the measuring the reticle shape deformation is based on one or more edge alignment marks on the reticle.

6. The method of clause 4, wherein the conditioning further comprises converting the measured reticle shape deformation to a reticle temperature using a finite element model (FEM).

7. The method of clause 1, wherein the conditioning comprises using a fixed amount of production substrates to determine when the reticle has reached the predetermined temperature.

8. The method of clause 1, wherein the conditioning comprises using decision-based and/or machine learning to determine when the reticle has reached the predetermined temperature.

9. The method of clause 8, wherein the using decision-based and/or machine learning comprises using a regression, a local regression, a non-parametric local regression, a kernel regression, a multivariate adaptive regression, regression trees, a Gaussian process regression, a support vector regression, splines, smoothing splines, nearest neighbors, a neural network, an adaptive window, Kalman filtering, a linear quadratic estimation, or a combination thereof.

10. The method of clause 1, wherein the conditioning comprises using key performance indicators (KPIs) based on a reticle alignment and/or a reticle shape deformation to determine when the reticle has reached the predetermined temperature.

11. The method of clause 1, wherein the conditioning comprises heating and/or cooling the reticle in a conditioning slot to flow gas over the reticle.

12. The method of clause 1, wherein the predetermined temperature is 22° C.±0.2° C.

13. The method of clause 1, wherein the reducing stress comprises removing the reticle from a reticle stage to a turret.

14. The method of clause 1, wherein the reducing stress comprises exposing the reticle and the non-production substrate to a zero dose of radiation.

15. The method of clause 14, wherein the exposing further comprises measuring a reticle shape deformation and calculating a reticle temperature.

16. The method of clause 1, wherein the calibrating comprises measuring a reticle shape deformation and calculating a reticle temperature.

17. The method of clause 1, wherein the calibrating comprises inline real-time calibration of the reticle heating model based on one or more non-production substrates and/or one or more non-production lots.

18. The method of clause 1, wherein the calibrating comprises evaluating the reticle heating model for each reticle alignment (RA) between the reticle and a plurality of non-production substrates in a non-production lot.

19. The method of clause 18, wherein the evaluating comprises updating a parameter x of the lithographic process by the following:

$$x_{new} = x_{old} + \gamma \cdot (x_{old} - RA_{results})$$

where $\gamma$ is a gain value and configured to filter out noise.

20. The method of clause 18, wherein the evaluating comprises evaluating a reticle alignment (RA) of each of the plurality of non-production substrates until a convergence of at least 90% is reached.

21. The method of clause 1, wherein the reticle heating model comprises one or more modal deformations describing a relationship between inputs and distortions resulting from the inputs to reduce noise in the reticle heating model.

22. The method of clause 1, further comprising predicting distortions of the reticle in a lithographic apparatus based on the reticle heating model and inputs in a lithographic process.

23. The method of clause 22, wherein the inputs in the lithographic process comprise a dose of radiation from a radiation source, a reticle temperature, a number of production substrates in a production lot, or a combination thereof.

24. The method of clause 22, further comprising determining a correction in the lithographic process based on the predicted distortions of the reticle.

25. The method of clause 24, wherein the correction is a correction of an alignment of a production substrate relative to the reticle.

26. A device manufacturing method using a lithographic process, the device manufacturing method comprising:
   conditioning a reticle in the lithographic process to adjust an initial temperature of the reticle to a predetermined temperature;
   reducing stress in the reticle to reduce parasitic thermal effects;
   calibrating a reticle heating model by exposing the reticle and a non-production substrate to a dose of radiation;
   patterning a dose of radiation with an image of the reticle with an illumination system;
   projecting the patterned dose of radiation onto a target portion of a production substrate with a projection system; and
   processing the production substrate by exposing the reticle and the production substrate to the patterned dose of radiation based on the reticle heating model.

27. The method of clause 26, further comprising predicting distortions of the reticle in a lithographic apparatus based on the reticle heating model and inputs in the lithographic process.

28. The method of clause 27, further comprising determining a correction in the lithographic process based on the predicted distortions of the reticle.

29. A lithographic apparatus comprising:

an illumination system configured to illuminate a reticle;

a projection system configured to project an image of the reticle onto a substrate; and a controller configured to reduce effects of heating and/or cooling the reticle in a lithographic process, the controller configured to:

condition the reticle in the lithographic process to adjust an initial temperature of the reticle to a predetermined temperature, reduce stress in the reticle to reduce parasitic thermal effects, calibrate a reticle heating model by exposing the reticle and a non-production substrate to a dose of radiation, and process a production substrate by exposing the reticle and the production substrate to a dose of radiation based on the reticle heating model.

30. A non-transitory computer readable medium program comprising computer readable instructions configured to cause a processor to:

condition a reticle in a lithographic process to adjust an initial temperature of the reticle to a predetermined temperature, reduce stress in the reticle to reduce parasitic thermal effects, calibrate a reticle heating model by exposing the reticle and a non-production substrate to a dose of radiation, and process a production substrate by exposing the reticle and a production substrate to a dose of radiation based on the reticle heating model.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of aspects in the context of optical lithography, it will be appreciated that aspects may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself may be patterned and materials added on top of it may also be patterned, or may remain without patterning.

The following examples are illustrative, but not limiting, of the aspects of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific aspects have been described above, it will be appreciated that the aspects may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary aspects as contemplated by the inventor(s), and thus, are not intended to limit the aspects and the appended claims in any way.

The aspects have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects will so fully reveal the general nature of the aspects that others can, by applying knowledge within the skill of the art, readily modify and/or adapt for various applications such specific aspects, without undue experimentation, without departing from the general concept of the aspects. Therefore, such adaptations and modifications are intended to be within the meaning and range of equivalents of the disclosed aspects, based on the teaching and guidance presented herein.

The breadth and scope of the aspects should not be limited by any of the above-described exemplary aspects, but should be defined only in accordance with the following claims and their equivalents.

The invention claimed is:

1. A method comprising:

conditioning a reticle to adjust an initial temperature of the reticle to a predetermined temperature;

exposing the reticle and a non-production substrate to a zero dose of radiation to reduce stress in the reticle to reduce parasitic thermal effects;

calibrating a reticle heating model by:
    exposing the reticle and the non-production substrate to a non-zero dose of radiation;
    measuring a reticle shape deformation; and
    calculating a reticle temperature.

2. The method of claim 1, wherein:

the conditioning comprises measuring a reticle alignment between the reticle and the non-production substrate to determine when the reticle has reached the predetermined temperature; and the measuring the reticle alignment is based on one or more alignment marks on the reticle.

3. The method of claim 1, wherein:

the conditioning comprises measuring a reticle shape deformation of the reticle to determine when the reticle has reached the predetermined temperature;

the measuring the reticle shape deformation is based on one or more edge alignment marks on the reticle; and the conditioning further comprises converting the measured reticle shape deformation to a reticle temperature using a finite element model (FEM).

4. The method of claim 1, wherein the conditioning comprises using a fixed amount of production substrates to determine when the reticle has reached the predetermined temperature.

5. The method of claim 1, wherein:

the conditioning comprises using decision-based and/or machine learning to determine when the reticle has reached the predetermined temperature; and the using decision-based and/or machine learning comprises using a regression, a local regression, a non-parametric local regression, a kernel regression, a multivariate adaptive regression, regression trees, a Gaussian process regression, a support vector regression, splines, smoothing splines, nearest neighbors, a neural network, an adaptive window, Kalman filtering, or a linear quadratic estimation, or a combination thereof.

6. The method of claim 1, wherein the conditioning comprises using key performance indicators (KPIs) based on a reticle alignment and/or a reticle shape deformation to determine when the reticle has reached the predetermined temperature.

7. The method of claim 1, wherein:

the conditioning comprises heating and/or cooling the reticle in a conditioning slot to flow gas over the reticle;

the predetermined temperature is 22° C.±0.2° C.; and the reducing stress comprises removing the reticle from a reticle stage to a turret.

8. The method of claim 1, wherein the calibrating comprises inline real-time calibration of the reticle heating model based on one or more non-production substrates and/or one or more non-production lots.

9. The method of claim 1, wherein:

the calibrating comprises evaluating the reticle heating model for each reticle alignment (RA) between the reticle and a plurality of non-production substrates in a non-production lot;

the evaluating comprises updating a parameter x of a lithographic process by the following:

$$x_{new} = x_{old} + \gamma \cdot (x_{old} - RA_{results})$$

where $\gamma$ is a gain value and configured to filter out noise; and/or the evaluating comprises evaluating the reticle alignment (RA) of each of the plurality of non-production substrates until a convergence of at least 90% is reached.

10. The method of claim 1, wherein the reticle heating model comprises one or more modal deformations describing a relationship between inputs and distortions resulting from the inputs to reduce noise in the reticle heating model.

11. The method of claim 1, further comprising:

predicting distortions of the reticle in a lithographic apparatus based on the reticle heating model and inputs in a lithographic process, wherein the inputs in the lithographic process comprise a dose of radiation from a radiation source, a reticle temperature, or a number of production substrates in a production lot, or a combination thereof; and determining a correction in the lithographic process based on the predicted distortions of the reticle, wherein the correction is a correction of an alignment of a production substrate relative to the reticle.

12. A lithographic apparatus comprising:

an illumination system configured to illuminate a reticle;

a projection system configured to project an image of the reticle onto a substrate; and a controller configured to reduce effects of heating and/or cooling the reticle in a lithographic process, the controller configured to:
    condition the reticle in the lithographic process to adjust an initial temperature of the reticle to a predetermined temperature,
    expose the reticle and a non-production substrate to a zero dose of radiation to reduce stress in the reticle to reduce parasitic thermal effects, and
    calibrate a reticle heating model by:
    exposing the reticle and non-production substrate to a non-zero dose of radiation,
    measuring a reticle shape deformation, and
    calculating a reticle temperature.

13. A non-transitory computer readable medium program comprising computer readable instructions configured to cause a processor to:

condition a reticle in a lithographic process to adjust an initial temperature of the reticle to a predetermined temperature, expose the reticle and a non-production substrate to a zero to a zero dose of radiation to reduce stress in the reticle to reduce parasitic thermal effects, and calibrate a reticle heating model by:
    exposing the reticle and non-production substrate to a non-zero dose of radiation,
    measuring a reticle shape deformation, and
    calculating a reticle temperature.

* * * * *